United States Patent [19]

Cartwright, Jr.

[11] Patent Number: 4,495,427

[45] Date of Patent: Jan. 22, 1985

[54] PROGRAMMABLE LOGIC GATES AND NETWORKS

[75] Inventor: James M. Cartwright, Jr., Cambria Heights, N.Y.

[73] Assignee: RCA Corporation, New York, N.Y.

[21] Appl. No.: 480,596

[22] Filed: Mar. 30, 1983

Related U.S. Application Data

[63] Continuation-in-part of Ser. No. 213,361, Dec. 5, 1980, abandoned.

[51] Int. Cl.³ .................. H03K 19/094; H03K 19/177
[52] U.S. Cl. ..................................... 307/469; 307/450; 307/451; 364/716
[58] Field of Search ............... 307/450, 451, 463, 465, 307/468–469, 580, 584, 585; 357/23 VT; 364/716; 365/95, 103, 104, 184, 185

[56] References Cited

U.S. PATENT DOCUMENTS

| | | | |
|---|---|---|---|
| 3,760,380 | 9/1973 | Hoffman et al. | 340/173 R |
| 3,818,452 | 6/1974 | Greer | 340/166 R |
| 4,041,459 | 8/1977 | Horninger | 307/463 X |
| 4,091,293 | 5/1978 | Ando | 307/205 |
| 4,091,359 | 5/1978 | Rossler | 340/166 R |
| 4,122,544 | 10/1978 | McElroy | 365/185 |
| 4,130,890 | 12/1978 | Adam | 365/184 |
| 4,162,504 | 7/1979 | Hsu | 357/23 |
| 4,175,290 | 11/1979 | Harari | 365/156 |
| 4,209,849 | 6/1980 | Schrenk | 365/182 |
| 4,237,547 | 12/1980 | Smith | 365/104 X |
| 4,258,378 | 3/1981 | Wall | 357/23 VT |
| 4,313,106 | 1/1982 | Hsu | 365/185 X |
| 4,375,087 | 2/1983 | Wanlass | 365/185 X |

FOREIGN PATENT DOCUMENTS

| | | |
|---|---|---|
| 2659199 | 7/1977 | Fed. Rep. of Germany . |
| 2606958 | 8/1977 | Fed. Rep. of Germany . |
| 2726094 | 1/1978 | Fed. Rep. of Germany . |
| 2743422 | 3/1979 | Fed. Rep. of Germany ........ 357/23 VT |
| 2842631 | 4/1980 | Fed. Rep. of Germany ........ 357/23 VT |
| 54-85648 | 7/1979 | Japan . |
| 1523859 | 9/1978 | United Kingdom . |

OTHER PUBLICATIONS

Chao, "Electrically Alterable Read-Only Memory Array", *IBM Tech. Disc. Bull.*, vol. 25, No. 1, Jun. 1982, pp. 41–43.

Krick, "Complementary MNOS Electronically Alterable Read-Only Memory", *IBM Tech. Disc. Bull.*, vol. 13, No. 1, Jun. 1970, pp. 263–264.

Scheibe et al., "Technology of a New n-Channel One-Transistor EAROM Cell Called SIMOS", *IEEE Trans. Elect. Devices*, vol. ED-24, No. 5, May, 1977, pp. 600–606.

Horninger, "A High-Speed ESFI SOS Programmable Logic Array with an MNOS Version", *IEEE-JSSC*, vol. SC-10, No. 5, 10/75, pp. 331–336.

Wilder et al., "Multiple Selective Write Alterable Read-Only Storage", *IBM TDB*, 2/75, vol. 17, No. 5, pp. 2595-5.

RCA Tech Note 1152, L. B. Medwin & A. C. Ipri "Floating Transistor-Gate Field Effect Transistor Memory Device" mailed May 24, 1976.

RCA Tech Note No. 1185, L. B. Medwin & A. C. Ipri, "FACMOS EAROM" mailed Jun. 24, 1977.

Array Logic Using FAMOS Devices, S. Dasgupta, IBM Technical Disclosure Bulletin, vol. 17, No. 10, pp. 2897–2899, Mar. 1975.

Electrically Programmable Logic Array, Grice et al., IBM Technical Disclosure Bulletin, vol. 22, No. 10, Mar. 1980.

*Primary Examiner*—Larry N. Anagnos
*Assistant Examiner*—David R. Hudspeth
*Attorney, Agent, or Firm*—Joseph S. Tripoli; George E. Haas; Allen LeRoy Limberg

[57] ABSTRACT

The network connections of the channels of complementary symmetry MOS FET's in a logic gate or array are altered electrically to program different logic responses to logic inputs. To this end, certain of the FET's are gate-injection or substrate-injection MOS FET's.

65 Claims, 15 Drawing Figures

PROGRAMMABLE LOGIC GATES AND NETWORKS

The government has rights in this invention pursuant to Contract No. DAAK 20-80-C-0292 awarded by the Department of the Army.

This is a continuation-in-part of like titled U.S. patent application Ser. No. 213,361 filed Dec. 5, 1980, now abandoned. The invention relates to electrically erasable, electrically programmable logic gates and networks.

Programmable arrays of logic gates are known in which the gates are connected by fusible links, which connections can be severed by passing currents much higher than those encountered when switching at normal logic levels through the fusible links to melt them away. Once programmed, these programmable logic arrays (PLA's) generally cannot be re-programmed.

Electrically programmable logic arrays, both light-erasable and electrically erasable, are known which employ metal-insulator-semiconductor field-effect transistors (FET's) that can have their threshold voltages ($V_T$'s) altered by application of higher-than-normal potential between selected ones of their electrodes. These prior art arrays have used the programmable-$V_T$ transistors themselves for responding to input logic signals to generate output logic signals, with selected ones of them rendered non-responsive to input logic signals by programming. This approach, while it can be economical of the number of FET's in the PLA, makes logic response thresholds dependent on the $V_T$'s of the programmable-$V_T$ FET's. This is undesirable to do in that here is variability among the $V_T$'s prior to programming owing to manufacturing process variations, further variability among the $V_T$'s owing to differences in response to programming voltage, variation in the $V_T$'s as a function of time elapsed since programming, and some variation in the $V_T$'s as a function of the number of times programming has occurred; all of these contribute to lack of definition of logic thresholds. Further, in complementary symmetry metal-oxide-semiconductor COS/MOS technology the problem of matching the conduction characteristics of p-channel and n-channel devices is complicated when they are programmable-$V_T$ types.

A variety of electrically erasable programmable-$V_T$ FET's are known wherein the metal-insulator-semiconductor device includes a floating gate structure. A first principal type is the GIMOS (gate-injection metal-oxide-semiconductor) transistor described by S. T. Hsu in his article "GIMOS—A Nonvolatile MOS Memory Transistor" appearing in *RCA REVIEW*, Sept. 1981, Vol. 42, No. 3. In this device injection of electrons and holes to the floating gate structure is predominantly from the normal control gate electrode of the transistor with injection from other electrodes and the transistor substrate suppressed. During its programming, the source and drain electrodes of a GIMOS transistor and its substrate are normally connected to a reference voltage, and a programming voltage is applied to its gate electrode. Varieties of GIMOS transistor are known where the alteration of $V_T$ is responsive only to source-to-gate voltage and only to drain-to-gate voltage, as well as to both, allowing the drain or source not to be connected to reference voltage during programming.

An FET of the GIMOS type can have the amplitude of its $V_T$ decreased by application of a programming voltage to its control gate electrode of a polarity tending to increase conduction of its channel and of an amplitude exceeding normal logic levels. Its $V_T$ can be increased by applying a programming voltage of opposite polarity and of an amplitude exceeding normal logic levels. A variant of the gate-injection non-volatile MOS memory transistor is the polysilicon-injection non-volatile MOS memory transistor in which injection is between an auxiliary, programming gate electrode and the floating gate structure.

A second principal type of non-volatile MOS memory transistor is the SIMOS (substrate-injection-metal-oxide-semiconductor) transistor. In this device, injection of electrons and holes is predominantly between the transistor substrate and the floating gate structure, with injection from the normal control gate electrode suppressed insofar as possible. To avoid inhibiting programming responsive to programming voltages applied to the normal control gate electrode, injection between the floating gate and the transistor source and drain electrodes can be suitably controlled by during programming connecting these electrodes to the reference voltage applied to the transistor substrate.

An FET of the SIMOS type can have the amplitude of its $V_T$ increased by application of a programming voltage to its control gate electrode of a polarity tending to increase conduction of its channel and of an amplitude exceeding normal logic levels. Its $V_T$ can be decreased by applying a programming voltage of opposite polarity and of an amplitude exceeding normal logic levels. That is, the GIMOS and SIMOS devices of the same conductivity type exhibit opposite programming responses to programming voltages of one sense of polarity or the other.

An aspect of the present invention is a method for providing electrically erasable, electrically programmable logic gates and networks wherein a logic output terminal has connections to each of two supply voltage terminals, at least one of which connections is to be selectively made at certain times. Such a selective connection includes the principal conduction paths of switching transistors, switched into conduction or non-conduction responsive to signals applied from logic input terminals to their control electrodes, and includes at least one channel of a respective programmable-$V_T$ field effect transistor. Programming voltages are applied for a time to each programmable-$V_T$ transistor to condition it thereafter to be in one of two states. (These programming voltages may advantageously be applied via the logic input terminals, to save on the number of terminals associated with the programmable logic circuitry where it is constructed in integrated form.) In one state the programmable-$V_T$ transistor is conditioned to be so strongly depletion-mode in its characteristics that while its gate receives voltage within a normal range, outside which programming voltages lie, the channel of that transistor is effectively a short-circuit. In the other state the programmable-$V_T$ transistor is conditioned to be so strongly enhancement-mode in its characteristics, its channel is effectively an open-circuit.

Another aspect of the present invention concerns programmable logic gates and networks themselves wherein the channels of metal-insulator-semiconductor transistors with floating gate structures selectively function as open-circuits or short-circuits, for selectively connecting metal-insulator-semiconductor transistors without floating gate structures to perform the desired logic functions.

Still other aspects of the invention are found in sub-combinations used in the programmable logic arrays. For example, a programmable-$V_T$ FET and a fixed-FET, with interconnected gate electrodes and with channels in parallel connection, together provide a programmable switching element that can be programmed to function as a short-circuit or as a switching transistor with the well-defined $V_T$ of a fixed-$V_T$ transistor. As a further example, a programmable-$V_T$ FET and a fixed-$V_T$ FET, with interconnected gate electrodes and with channels in series connection, together provide a programmable switching element that can be programmed to function as an open-circuit or as a switching transistor with the well-defined $V_T$ of a fixed-$V_T$ transistor.

Figure 1:
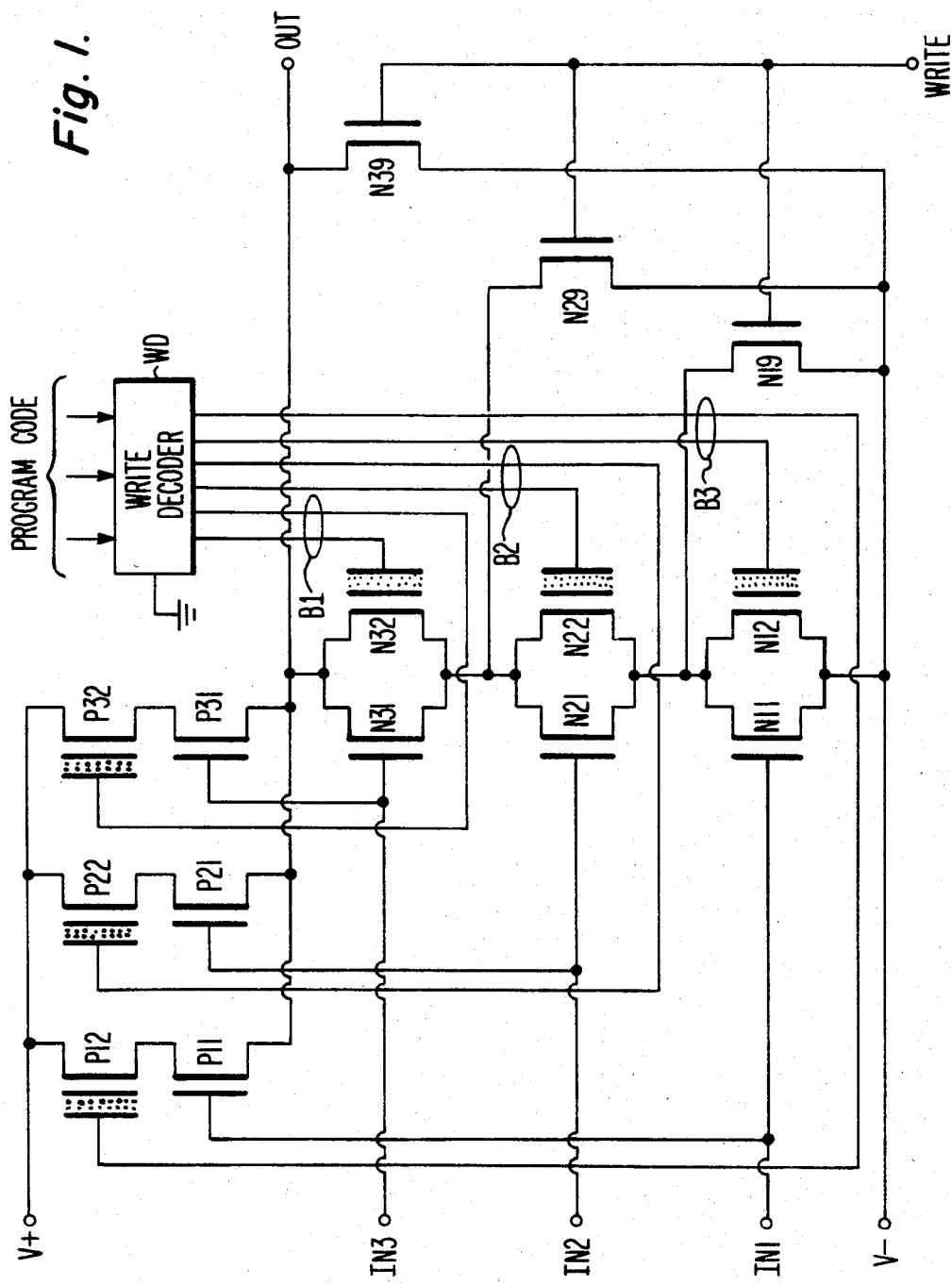
FIG. 1 is a schematic diagram of a programmable logic gate employing GIMOS transistors and embodying the invention.
Figure 2:
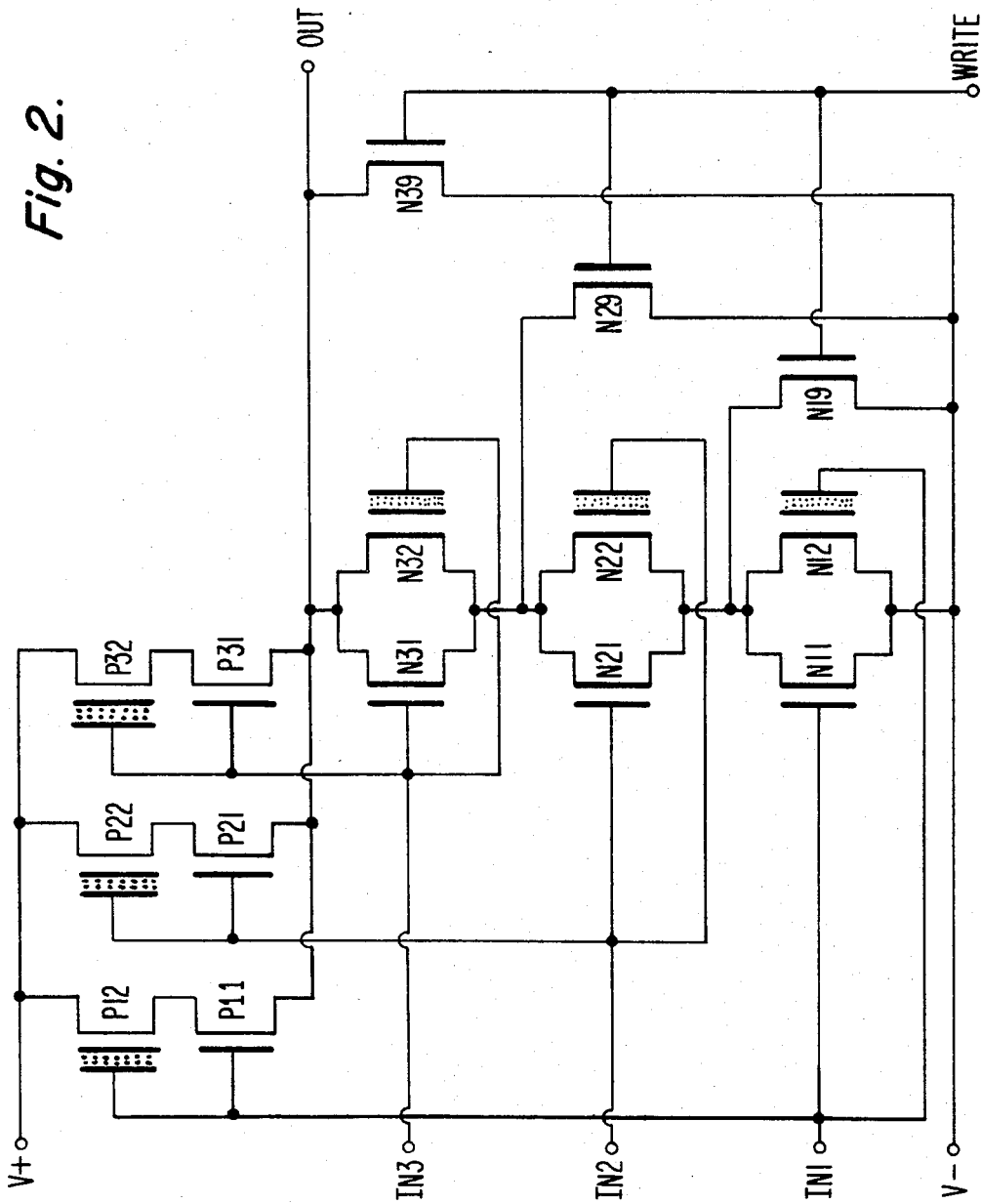
FIG. 2 is a schematic diagram of a variant of the FIG. 1 programmable logic gate, also employing GIMOS transistors and embodying the invention.
Figures 3, 4:
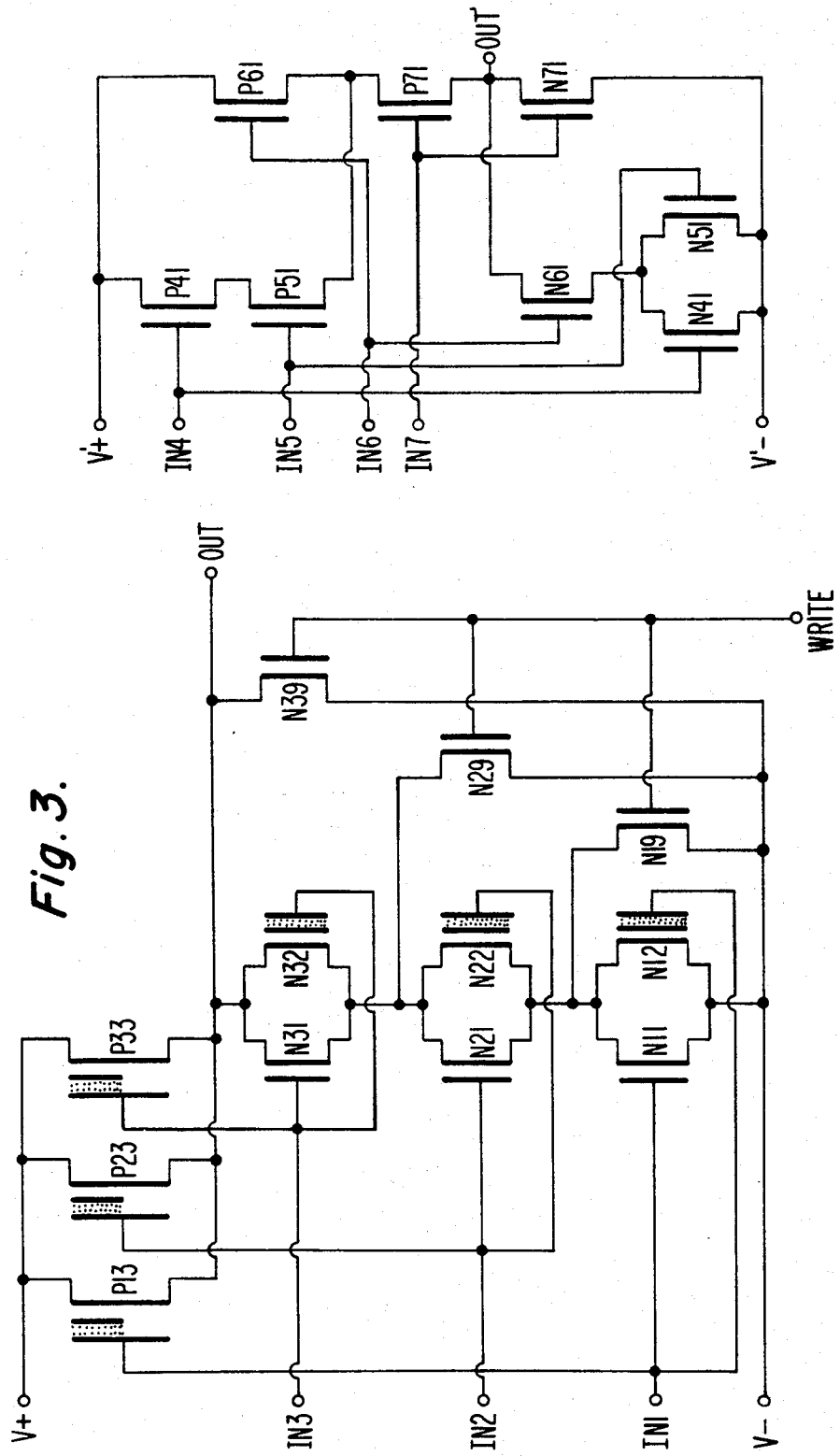
FIG. 3 is a schematic diagram of a variant of the FIG. 2 programmable logic gate, also employing GIMOS transistors and embodying the invention.
FIGS. 4, 5 and 6 are a schematic diagram of a non-programmable COSMOS logic network, a schematic diagram of a portion of a programmable logic network generated from the FIG. 4 logic network, and a schematic diagram of a programmable logic network derived by a reduction process from the FIG. 5 network, employing GIMOS transistors and embodying the invention.
Figure 7:
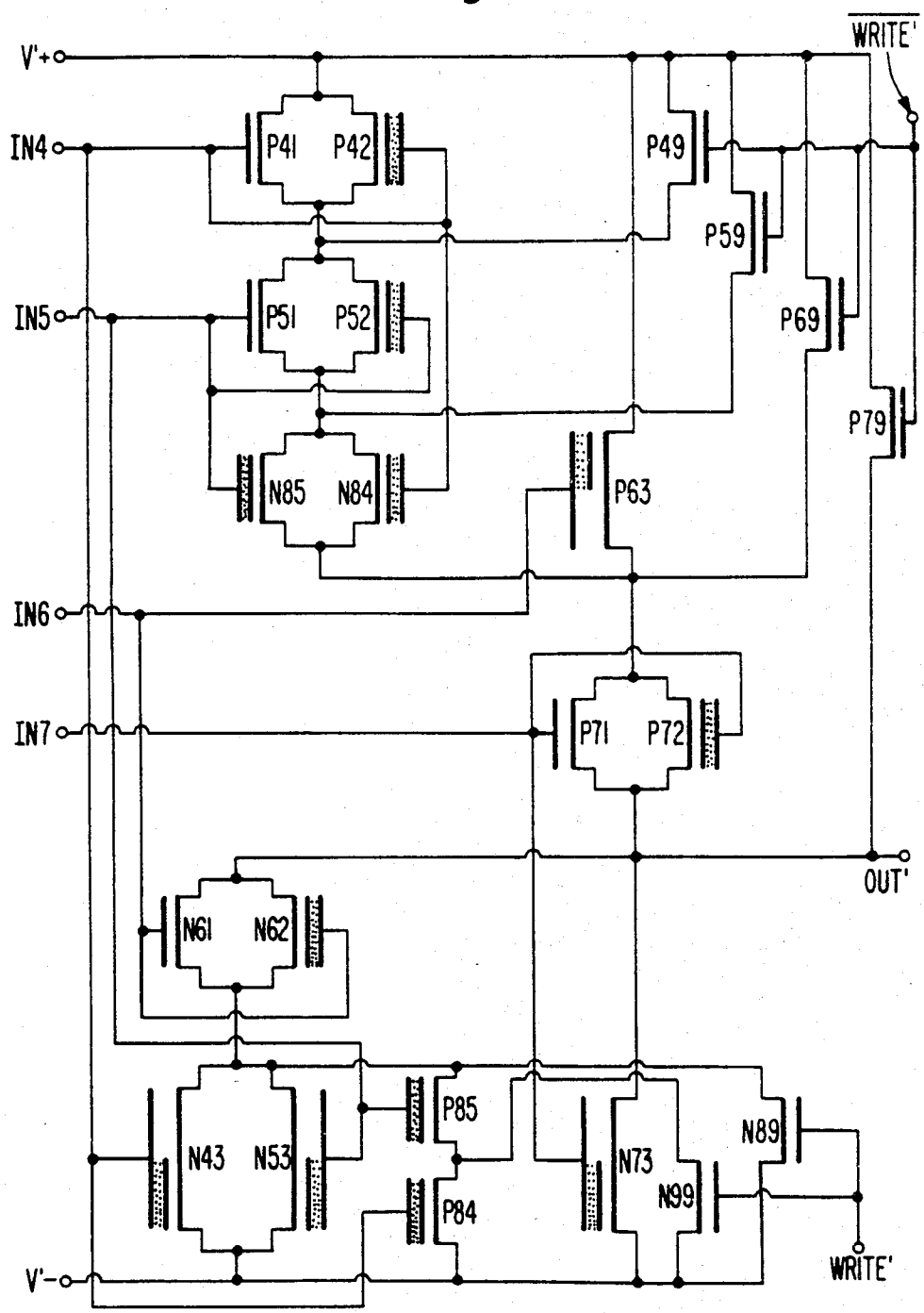
FIG. 7 is a schematic diagram of a variant of the FIG. 6 programmable logic network, also employing GIMOS transistors and embodying the invention.
Figure 8:
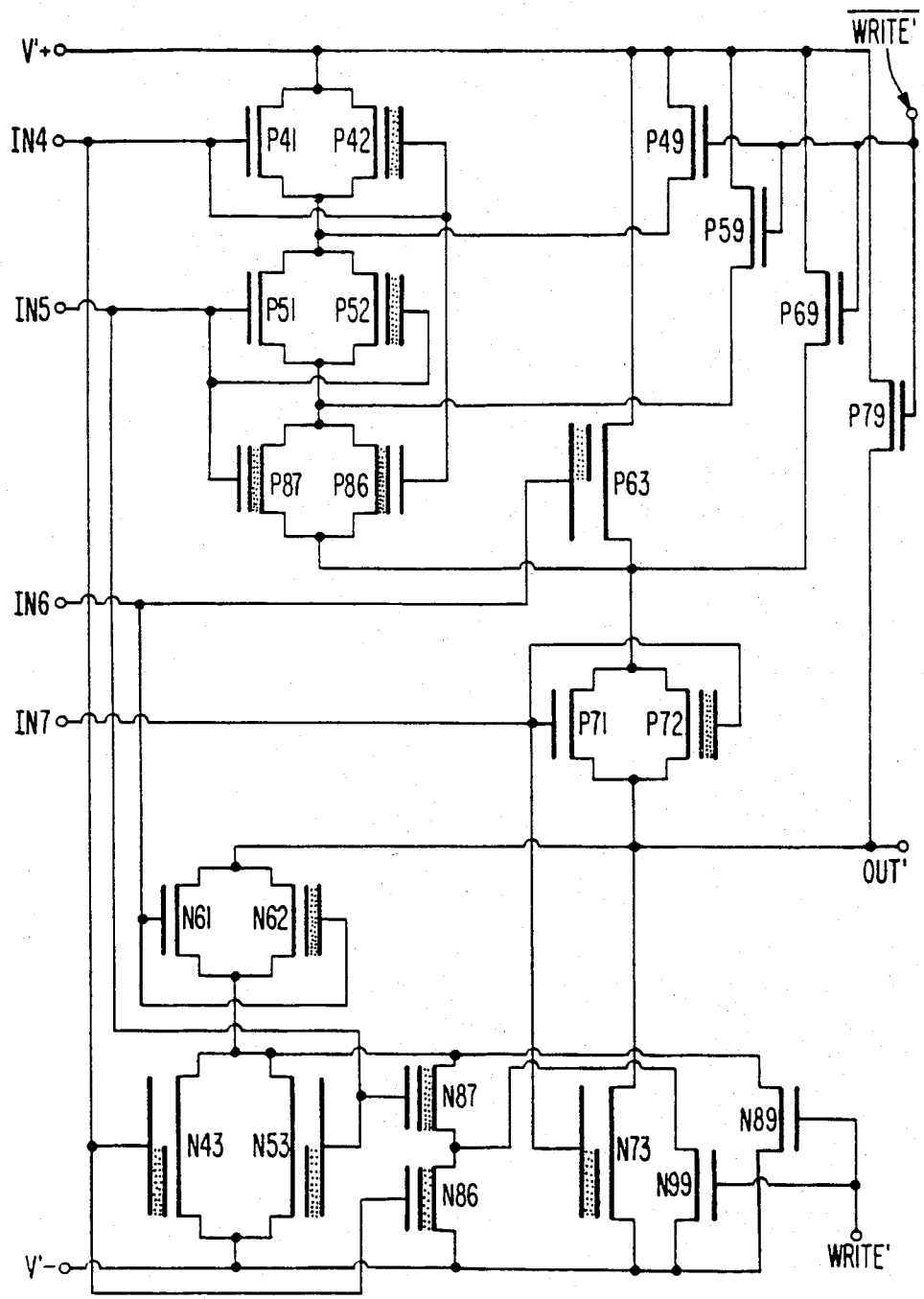
FIG. 8 is a schematic diagram of a modification that can be made to the FIG. 7 programmable logic network, replacing certain GIMOS transistors with SIMOS transistors, to provide a further embodiment of the invention.
Figure 9:
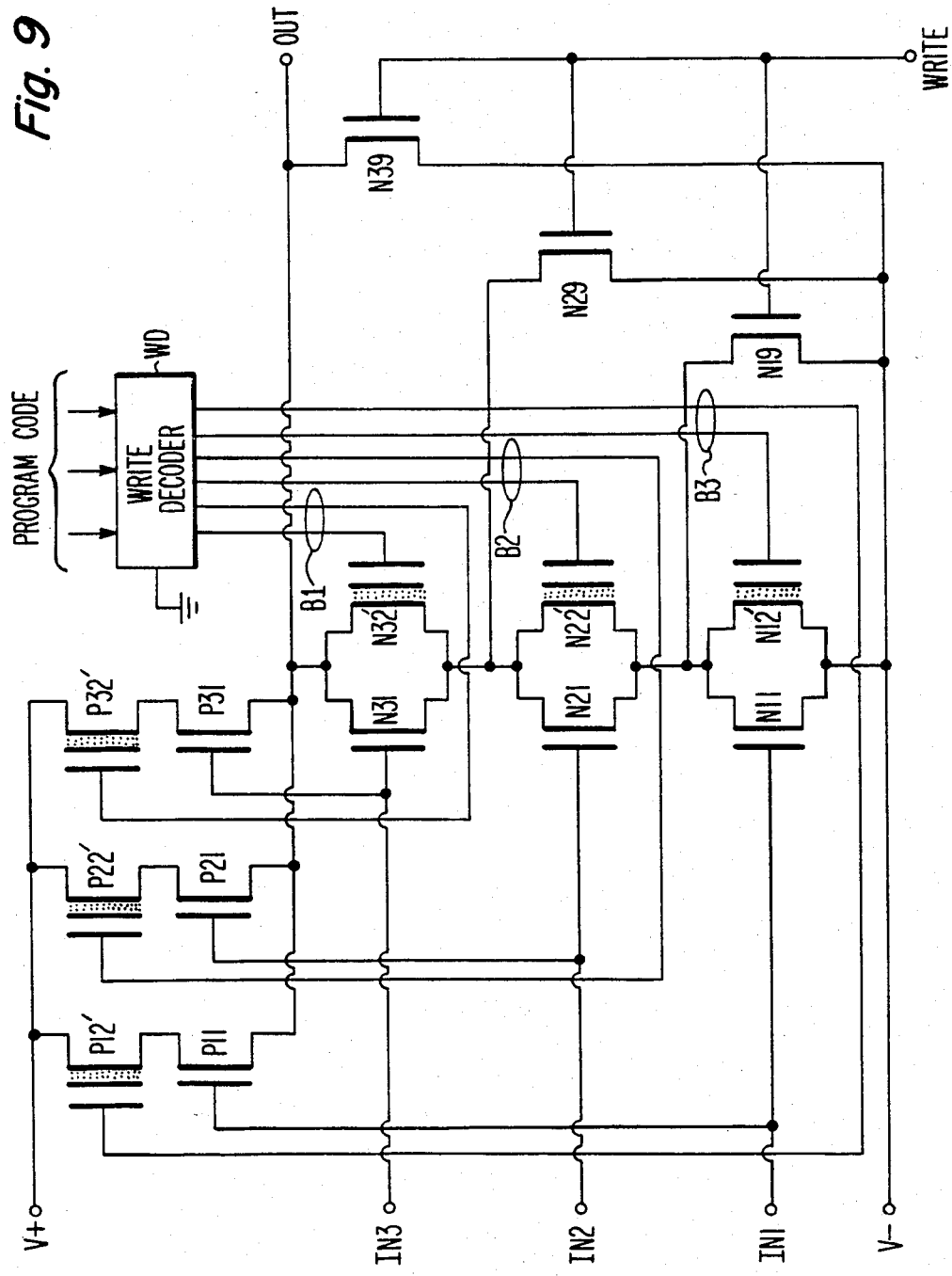
Figure 10:
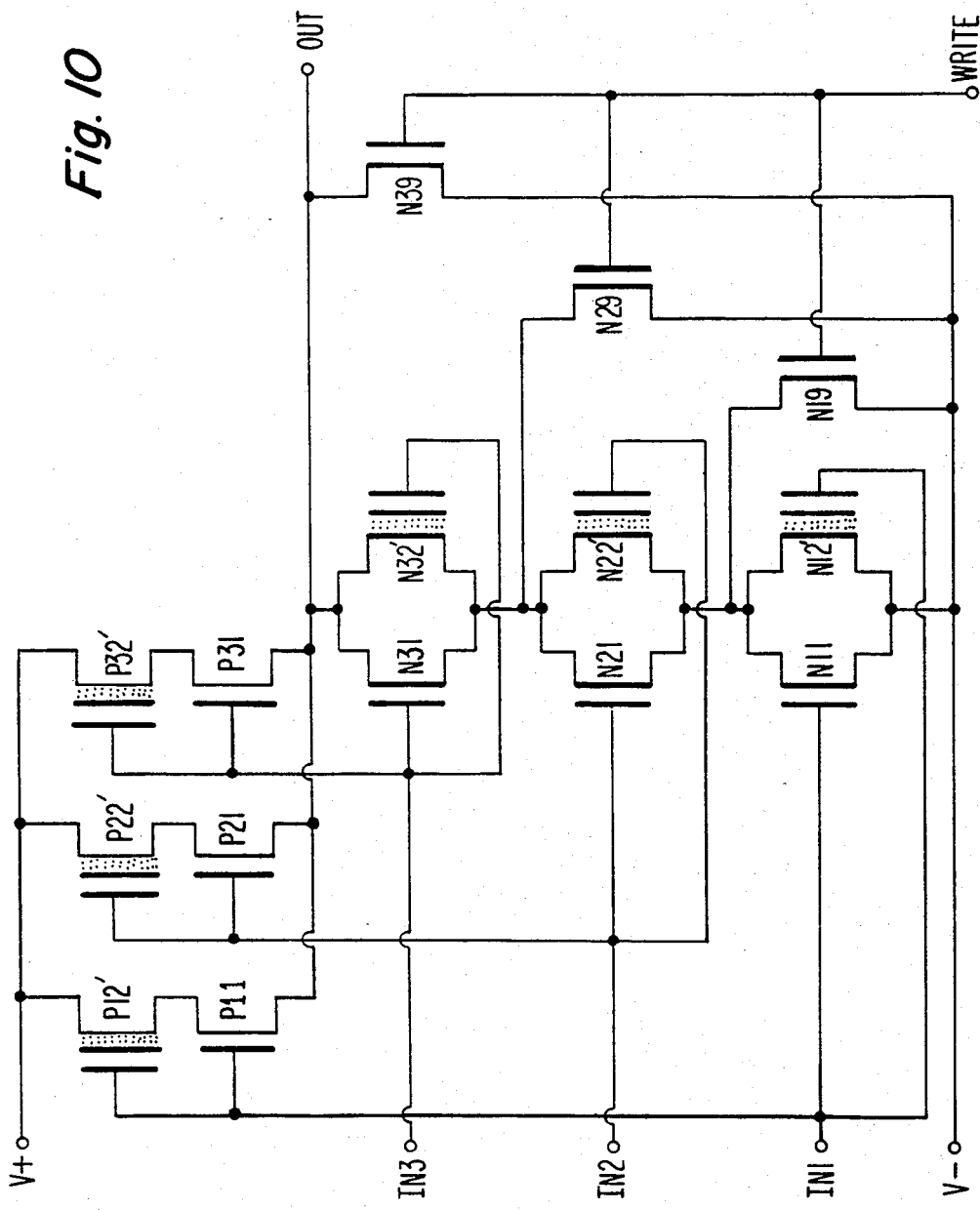
Figure 11:
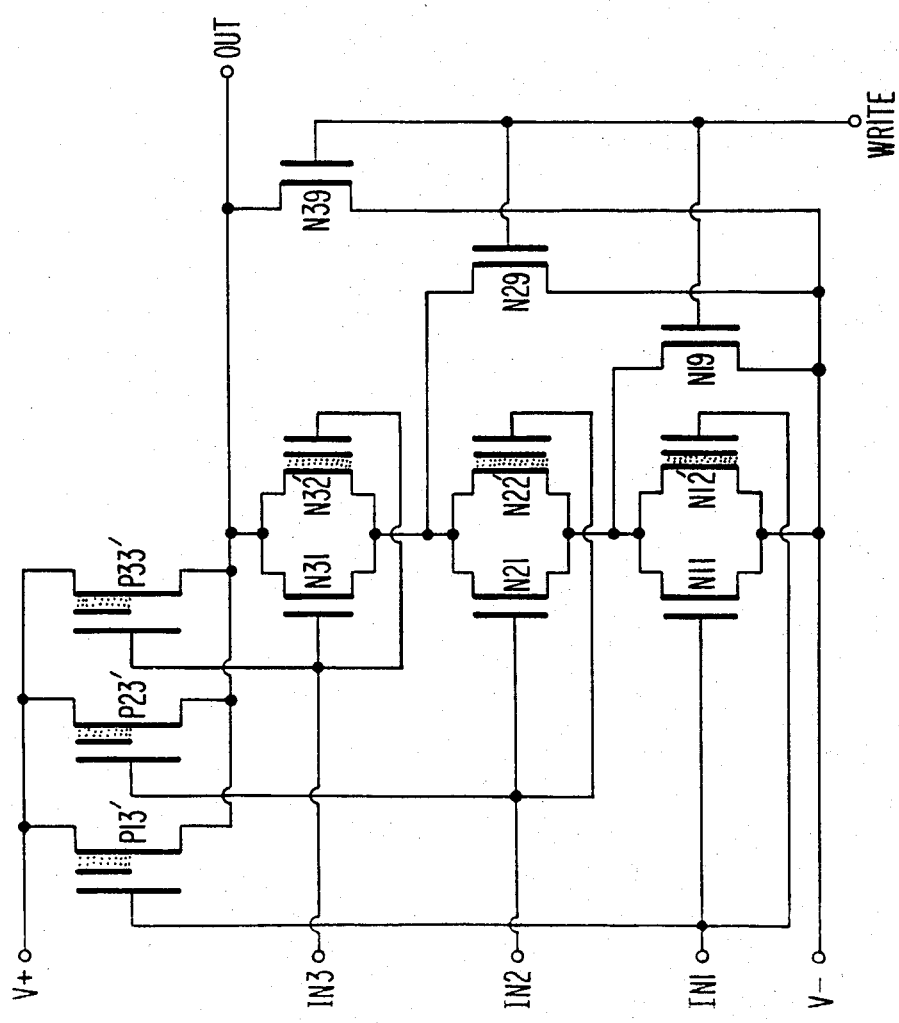
Figure 12:
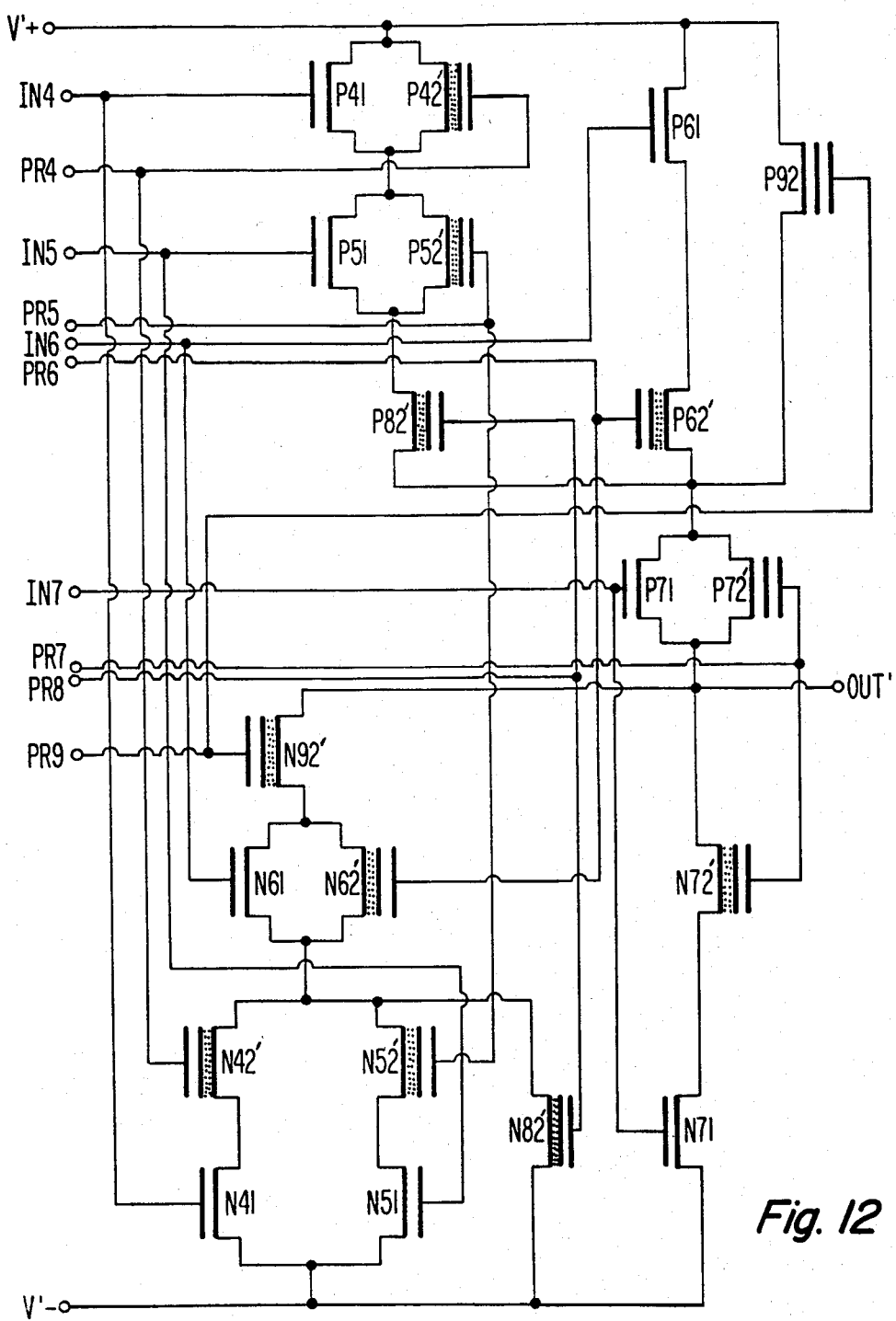
Figure 13:
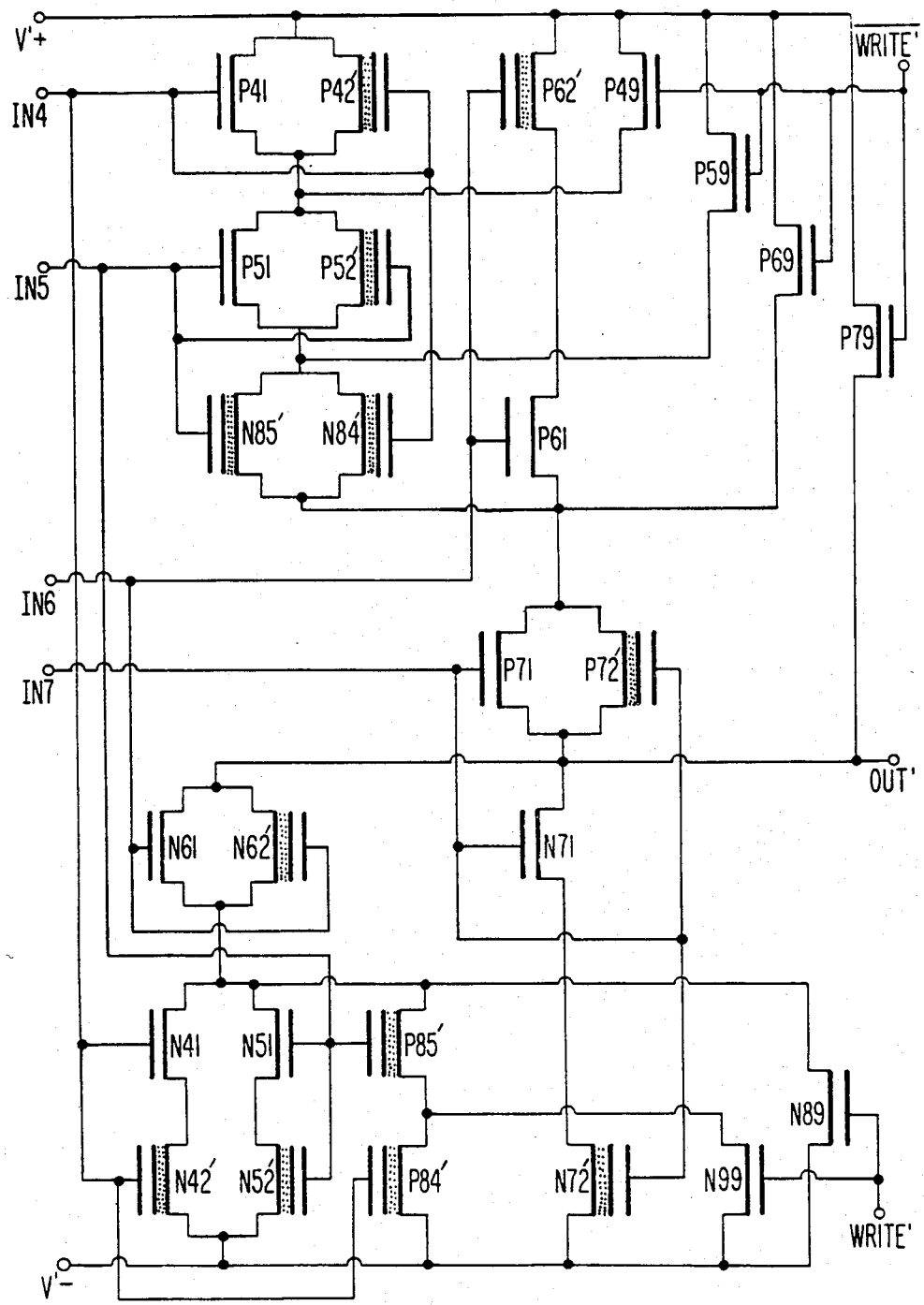
Figure 14:
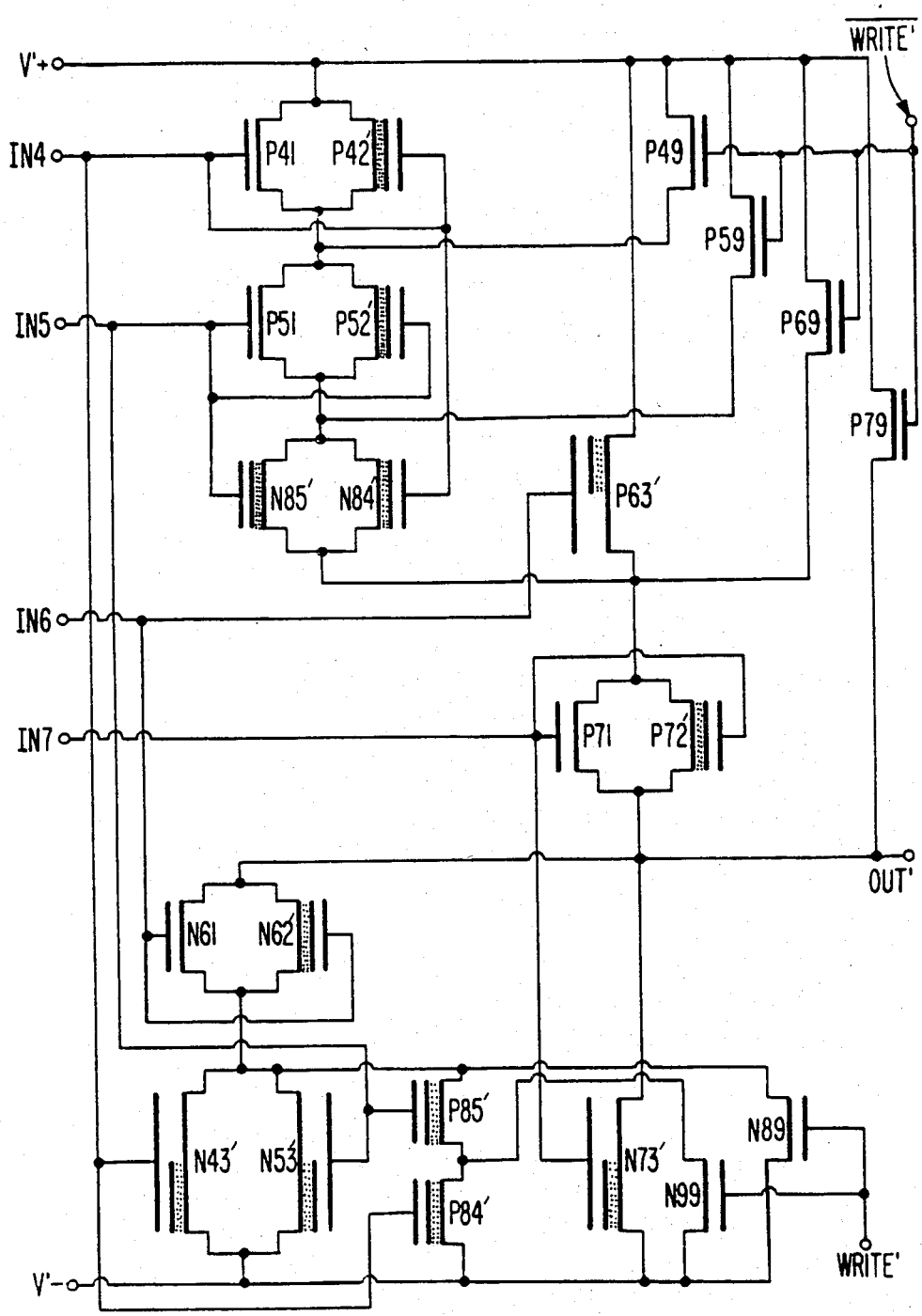
Figure 15:
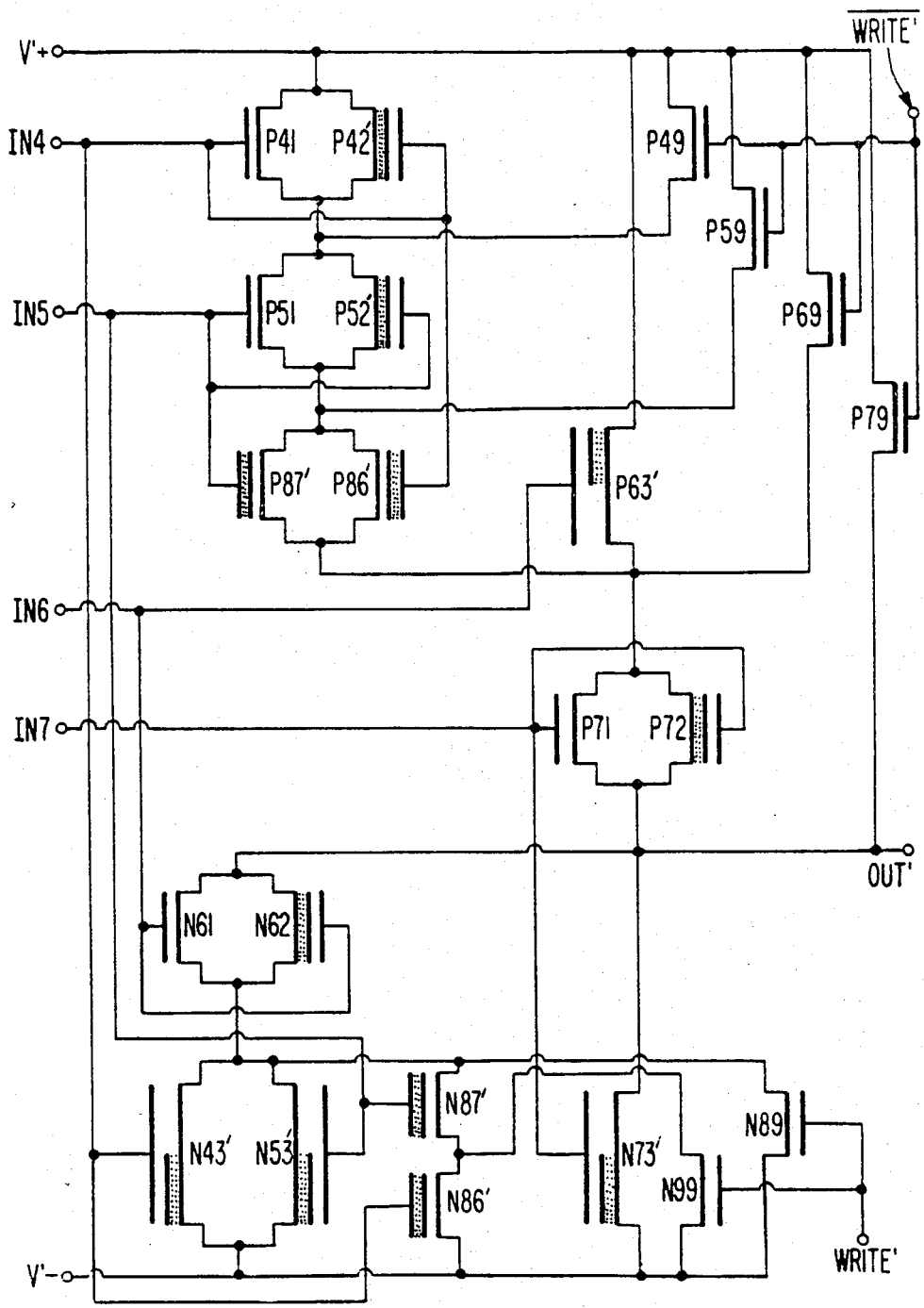

FIGS. 9, 10, and 11 are schematic diagrams of programmable logic gates embodying the invention, which are similar to those of FIGS. 1, 2 and 3, respectively, except for employing SIMOS rather than GIMOS transistors; and FIGS. 12, 13, 14 and 15 are schematic diagrams of programmable logic gates embodying the invention, which are similar to those of FIGS. 5, 6, 7 and 8, respectively, except for employing SIMOS rather than GIMOS transistors.

The drawings use symbols for the non-volatile memory metal-insulator-semiconductor devices wherein a bar representative of the floating gate structure is inserted between the bars representative of the normal, wired control gate and the channel in the conventional integrated FET symbol. Stipple appears between the control gate bar and floating gate bar in the symbol for a GIMOS structure. In a SIMOS structure the stipple appears between the floating gate bar and the channel bar. The non-volatile memory device may have its control gate bar and channel bar extended past the floating gate to indicate a composite structure combining a fixed-$V_T$ MOS with a GIMOS or SIMOS transistor.

Referring to FIG. 1, p-channel FET's P11, P21, P31 and n-channel FET's N11, N21, N31, N19, N29, N39 shown with single gate structures are MOS FET's with fixed $V_T$'s. P11, P21, P31 have their gates interconnected at terminals IN1, IN2, IN3, respectively, with the gates of N11, N21, N31, respectively, to form respective COS/MOS pairs—i.e., the devices all have similar amplitude $V_T$'s, the $V_T$'s of the p-channel devices being negative and the $V_T$'s of the n-channel devices being positive, as measured from source to gate. When the interconnected gates of the p-channel and n-channel devices in the COS/MOS pair are switched to one of the operating voltages V+ and V−, only one of the devices will be conditioned to conduct. This essentially eliminates stand-by power consumption in logic configurations, and the COS/MOS pairs draw appreciable power from the operating voltage supplies only when switching from conduction to non-conduction or from non-conduction to conduction.

The processing to integrate the p-channel devices and n-channel devices together within the confines of monolithic dies may, like standard COS/MOS processing, involve the use of an n-type integrated-circuit, (i-c) substrate on which the p-channel devices are formed and p-type isolation well(s) in the n-type substrate on which the n-channel devices are formed, the n-type i-c substrate and the p-type isolation well(s) being respectively connected to terminals V+ and V−. Or the so-called complementary COS/MOS process commonly used for integrating COS/MOS together with CCD elements can be used, in which p-type i-c substrate has the n-channel devices disposed thereon and in which the p-channel devices are disposed on n-type isolation wells in the p-type i-c substrate. The p-type i-c substrate and the n-type isolation well(s) connect respectively to terminals V+ and V− in this approach. In silicon-on-sapphire the substrates of the FET's of opposite conductivity types are inherently separate. In this disclosure the term "substrate" unpreceded by "integrated-circuit" or "i-c" will hereafter refer to the substrate of the FET device without regard to whether it is the i-c substrate or an isolation well.

P-channel FET's P12, P22, P32 and n-channel FET's N12, N22, N32 are shown with further, respective floating gate structures in addition to their wired gate structures and are GIMOS FET's. Assume by way of example the GIMOS FET's are of the type that can be programmed responsive to just source-to-gate voltages. Application between the source and gate of one of the n-channel GIMOS FET's N12, N22, N32 of a programming source-to-gate voltage that is positive in polarity and much larger in amplitude than (V+)-(V−) will alter the charge stored between its channel and floating gate such that, until it is re-programmed, the FET responds to normal logic levels with behavior typical of a depletion-mode device, its channel being fully conductive for any source-to-gate potential (or $V_{GS}$) in a range including zero and all positive values. That is, the n-channel GIMOS FET behaves like a short-circuit between its source and drain for the operating voltages encountered during normal logic operation.

On the other hand, application of a sufficiently large negative programming source-to-gate potential between the source and gate of this n-channel GIMOS FET will alter the charge stored between its channel and floating gate to cause it to respond to normal logic levels with behavior like that of an enhancement-mode FET with a $V_T$ substantially larger than (V+)-(V−). That is, the n-channel GIMOS FET behaves like an open-circuit between its source and drain for the operating voltages encountered during normal logic operation.

Analogously, a p-channel GIMOS FET can be programmed to operate as a short-circuit between source and drain after being programmed with a negative source-to-gate voltage of amplitude substantially larger than $(+V)-(-V)$ applied between source and gate, or to operate as an open-circuit between source and drain after being programmed with a sufficiently large positive source-to-gate voltage applied between source and gate.

In FIG. 1 a write decoder WD responds to a 3-bit binary number to program the GIMOS FET's within the following constraints. The p-channel of P11 is a short-circuit if the n-channel of N11 is an open-circuit, and conversely is an open-circuit if the n-channel of N11 is a short-circuit. The p-channel of P21 is a short circuit if the n-channel of N21 is an open-circuit, and conversely is an open-circuit if the n-channel of N21 is a short-circuit. The p-channel of P31 is a short circuit if the n-channel of N31 is an open-circuit, and conversely is an open-circuit if the n-channel of N31 is a short-circuit. The p-channel and n-channel GIMOS FET's can be so constructed that the same programming voltage can be simultaneously applied to those bearing identification alphanumerics having identical numerical portions, so that two-conductor programming-voltage buses B1, B2 and B3 can be replaced by respective single-conductor buses, at least in part. The programming voltages from write decoder WD are presumed to be referenced with respect to a ground potential intermediate between V− and V+, and they are applied to the gate electrodes of the GIMOS FET's. The gate voltages of these $V_T$'s are presumed to be left at a potential in the range between −V and +V inclusive when programming voltages are no longer being applied.

The source electrodes of p-channel GIMOS FET's P12, P22, P32 connect to the positive supply voltage rail running from terminal V+, so the application of source-to-gate programming voltages to them is straightforwardly accomplished by applying to their gates the voltages as referred to ground. The source electrode of n-channel GIMOS FET N12 connects to the negative supply voltage rail running from terminal V−, so the application of source-to-gate programming voltage to it is straightforwardly accomplished also by changing gate voltage. Problems arise, however, when one attempts to apply programming voltage to the gate of one of the n-channel GIMOS FET's N22 or N32 inasmuch as neither end of its channel is referred to ground, V− or V+ potential. N-channel FET N19 with source connected to receive V− responds to a positive-logic "high" or "one" (i.e., a negative-logic "low" or "zero") applied to its gate to apply V− potential to the interconnected drain of N12 and source of N22, to permit source-to-gate voltage programming of N22 (as well as drain-to-gate voltage programming of N12). N-channel FET N29 with source connected to receive V− responds to a positive-logic "high" or "one" applied to its gate to apply V− potential to the interconnected drain of N22 and source of N32, to permit source-to-gate voltage programming of N32 or drain-to-gate voltage programming of N22. N-channel FET N39 with source connected to receive V− responds to a positive-logic "high" or "one" applied to its gate to apply V− potential to the drain of N32 to permit drain-to-gate voltage programming of N32. The positive-logic "high" or "one" is applied simultaneously to the gates of N19, N29, N39 via a terminal WRITE. In certain logic configurations it may be desirable to reverse the order of the serial connection of the GIMOS and fixed-$V_T$ FET's as between terminal +V and OUT, causing a problem of applying programming voltages to the GIMOS FET similar to that encountered when programming N22 and N32; the solution to the problem is analogous to that used for solving the problem with programming N22 and N32, with a P-channel fixed-$V_T$ FET being activated to short one of the ends of the channel of the GIMOS FET to terminal V+.

The clamping of otherwise unreferenced nodes during programming may be viewed as the reconnection of portions of the circuitry during programming such that: all the channels of the programmable-$V_T$ p-channel FET's therein are paralleled with each other with at least first ends of their channels connected to a point of reference voltage (e.g., V+) against which the programming voltages applied to their respective gates can be referred, and all the channels of the programmable-$V_T$ n-channel FET's therein are paralleled with each other with at least the first ends of their channels connected to a point of reference voltage (e.g., V−) against which the programming voltages applied to their respective gates can be referred. In taking such a view one must be careful to exclude from such connections the circuitry connecting directly to the logic output terminal OUT, if the reference voltages against which the p-channel and n-channel programmable $−V_T$ FET's are respectively programmed differ. This is necessary to prevent the introduction of a crow-bar short between these reference voltages during programming. In more complex programmable logic arrays, as will be described further on in this specification, particularly those constructed from standard-cell semiconductor layout and specialized metalization patterns, it is usually convenient to program with the V+ and V− terminals connected to a common voltage during programming and to arrange for clamping of all circuit nodes to that common voltage—in effect, paralleling the channels of all programmable-$V_T$ FET's. This form of programming inherently avoids the problem of crow-bar shorting during programming. This form of programming is necessary in all cases, even for the simplest logic gate, when the GIMOS transistor is of the type requiring programming voltages be applied both as source-to-gate and drain-to-gate potentials.

The transistors which are used to clamp otherwise unreferenced nodes during programming should be large enough devices to conduct, without coming out of tight voltage clamp, the currents that flow in the channels of the GIMOS FET's being programmed (or the SIMOS FET's being programmed in analogous circuitry employing them). There generally is no need for these clamp transistors to operate at high speed, so their larger size is acceptable. One attractive feature of the programmable logic of the invention is that the programming voltage sources and the source applying voltage to terminal WRITE all supply FET gates, so the loading on them and the buses they supply is small. This permits the use of polycrystalline-silicon for these buses, supposing the programmable logic gate to be monolithically integrated on the surface of bulk silicon or of silicon-on-sapphire.

The FIG. 1 circuit will by analogy to known COS/MOS logic gates be a 3-input NAND gate for positive-logic input signals applied to its three input terminals IN1, IN2, and IN3 and taken from its output terminal OUT, or a 3-input NOR gate for negative logic signals, providing that the programming has conditioned the GIMOS FET's as follows. P-channel GIMOS FET's P12, P22, P32 are programmed to short-circuit the sources of fixed-$V_T$ p-channel FET's P11, P21, P31 to terminal V+; and n-channel GIMOS FET's N12, N22, N32 are programmed to be open-circuits across the channels of fixed-$V_T$ n-channel FET's N11, N21, N31, respectively. If one and only one of the p-channel GIMOS FET's P12, P22, P32, is programmed as an open-circuit rather than short-circuit and if the n-channel GIMOS FET having the same first digit in the numerical portion of its identification alphanumeric is programmed as a short-circuit, the FIG. 1 circuit will by analogy to known COSMOS logic gates be a 2-input NAND gate for positive-logic signals applied to two of its input terminals and will be non-responsive to signal applied to the others of its input terminals. If two of the p-channel GIMOS FET's P12, P22, P32 are programmed as open-circuits and the n-channel GIMOS FET's having corresponding first digits in the numerical portions of their identification alphanumeric are programmed as short-circuits, the FIG. 1 circuit will be analogous to a simple COS/MOS inverter, inverting logic signals applied to one of its input terminals and being non-responsive to logic signals applied to either or both of its other input terminals. The positive-logic logic equations respectively describing the responses $T_1$, $T_2$, $T_3$, $T_4$, $T_5$, $T_6$, $T_7$, $T_8$ at terminal OUT to input logic signals $I_1$, $I_2$, $I_3$ applied to terminals IN1, IN2, IN3, respectively, are tabulated below, together with the conditions of the GIMOS FET's for generating such responses.

| PROGRAMMING CODE $V_{12}$-$V_{22}$-$V_{32}$ | SHORT-CIRCUIT GIMOS FET's | OPEN-CIRCUIT GIMOS FET's | LOGIC EQUATION |
|---|---|---|---|
| 000 | P12,P22,P32 | N12,N22,N32 | $T_0 = \overline{I_1 \cdot I_2 \cdot I_3}$ |
| 001 | P12,P22,N32 | N12,N22,P32 | $T_1 = \overline{I_1 \cdot I_2}$ |
| 010 | P12,N22,P32 | N12,P22,N32 | $T_2 = \overline{I_1 \cdot I_3}$ |
| 011 | P12,N22,N32 | N12,P22,P32 | $T_3 = \overline{I_1}$ |
| 100 | N12,P22,P32 | P12,N22,N32 | $T_4 = \overline{I_2 \cdot I_3}$ |
| 101 | N12,P22,N32 | P12,N22,P32 | $T_5 = \overline{I_2}$ |
| 110 | N12,N22,P32 | P12,P22,N32 | $T_6 = \overline{I_3}$ |
| 111 | N12,N22,N32 | P12,P22,P32 | $T_7 = 0$ |

The logic equations above and in the remainder of this specification are written using the normal conventions wherein the logical complement of a signal is indicated by over-scoring it with a bar, wherein the AND function is indicated by a dot product symbol and wherein the OR function is indicated by a + sign. The "programming code" in the left hand column of the table above describes (in "high" and "low" terms expressed as "one" and "zero", respectively) the program voltages applied to cause the transistor conduction characteristics shown in the middle columns of the table. $V_{12}$ is the voltage applied to the gates of P12 and N12; $V_{22}$ is the voltage applied to the gates of P22 and N22 and $V_{32}$ is the voltage applied to the gates of P32 and N32.

FIG. 2 shows the FIG. 1 programmable logic gate modified so that programming voltages are applied via the same lines used for conducting logic signals, as is often done in prior art programmable logic arrays. FIG. 3 shows a modification of the FIG. 2 logic gate wherein each series connection of a fixed-$V_T$ FET and a GIMOS FET with floating gate disposed symmetrically over the channel between its source and drain regions is replaced by its electrical equivalent, a single GIMOS FET with floating gate asymmetrically disposed over the channel between its source and drain regions to overlap just one of these regions (shown as being the source). Homologs of the FIGS. 1, 2 and 3 programmable logic gates, wherein p-channel FET's are replaced by n-channel FET's of corresponding types and wherein supply voltage polarities are reversed to suit, so as to form positive-logic NOR gates or negative-logic NAND gates, are, of course, possible.

Those familiar with COS/MOS logic design know that an array of individual NAND and NOR gates interconnected in parallel cascade connections can usually be reduced to a simpler connection in which the NAND and NOR functions are no longer separable into individual collections of devices. The invention is applicable to such logic arrays, as well as to a single plural-input programmable logic gate. To describe the procedure for doing this in a general context is difficult and cumbersome, so a specific example of the designing of such a network will be described, which should enable a logic designer of ordinary skill to practice the invention in such arrays.

First, a general logic equation known from experience to be of sufficient complexity to provide for all desired programming alternatives must be selected. As the specific example, let us assume the following logic equation to be the selected general logic equation.

$$T_0 = [\overline{I_7}] \cdot [(\overline{I_6}) + (\overline{I_5} \cdot \overline{I_4})]$$

The form of the logic equation with inputs all barred or "low" to cause the output to be "high" indicates to one familiar with COSMOS logic design that with all the inputs low the equivalent non-programmable COS/MOS logic array should have a high-conductance network between terminals V'+ and OUT and have a high-impedance network between terminal OUT and V'−. The high-conductance network would comprise p-channel FET's switched to short-circuit condition, and the high-impedance network would comprise n-channel FET's switched to open-circuit condition. The logic equation is bracketed somewhat unusually so that every term is ANDed or ORed with a term bearing a brace of the same order; this is done to simplify the application of the following rules. For high-conductance networks the AND terms of a logic equation signify series connections of short-circuit switch elements; and the OR terms, parallel connections of short-circuit switch elements. For high-impedance networks, on the other hand, the AND terms of a logic equation signify parallel connections of open-circuit switch elements; and the OR terms, series connections of open-circuit switch elements.

Applying the first of these rules to the selected general logic equation, the ANDing of $\overline{I_4}$ and $\overline{I_5}$ requires a series connection of the conductive p-channels of FET's P41 and P51 in the conventional unprogrammable COS/MOS logic array shown in FIG. 4. The ORing of $(\bar{I}_6)$ with $(\bar{I}_5 \cdot \bar{I}_4)$ requires the parallelling of the p-channel of FET P61 with this series connection. The ANDing of the $[(\bar{I}_6)+(\bar{I}_5 \cdot \bar{I}_4)]$ logic term associated with the resulting parallel-series circuit and of the $[\bar{I}_7]$ logic term requires that the parallel-series circuit be in series connection with the p-channel of a further FET P71. The gates of P41, P51, P61, P71 connect to input terminals IN4, IN5, IN6, IN7 respectively for receiving the input positive-logic signals $I_4$, $I_5$, $I_6$, $I_7$ respectively, which control their respective conduction.

Applying the second of these rules to the selected general logic equation, the ANDing of $\bar{I}_4$ and $\bar{I}_5$ requires a parallel connection of the non-conductive n-channels of FET's N41 and N51. The ORing of $(\bar{I}_6)$ with $(\bar{I}_5 \cdot \bar{I}_4)$ requires the series connection of the n-channel of FET N61 with this parallel connection. The ANDing of the $[(\bar{I}_6)+(\bar{I}_5 \cdot \bar{I}_4)]$ logic term associated with the resulting series-parallel circuit and of the $[\bar{I}_7]$ logic term requires the series-parallel connection be parallelled by the n-channel of a further FET N71. The gates of N41, N51, N61, N71 connect to input terminals IN4, IN5, IN6, IN7 respectively for receiving the input positive-logic signals $I_4$, $I_5$, $I_6$, $I_7$ which control their respective conduction.

Figure 5:
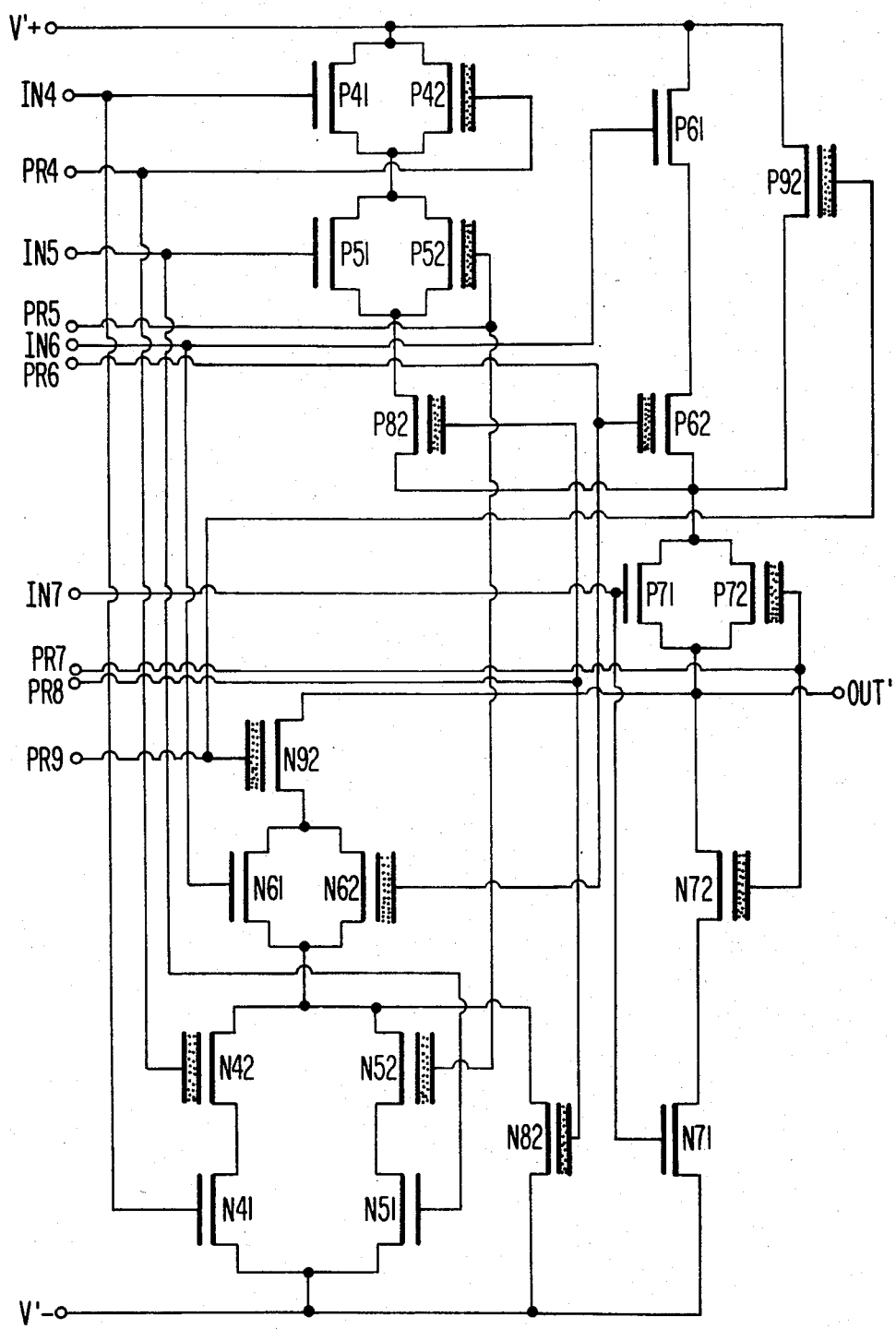

FIG. 5 shows the first step to be taken to convert the non-programmable logic network of FIG. 4 into a programmable logic array in accordance with the invention. The respective switches for short-circuiting all circuit nodes to a supply voltage terminal during the programming of the array are omitted for clarity. The series and parallel connections of transistors to be described are, more precisely, series and parallel connections of their conduction channels unless otherwise specifically described.

The NAND and NOR gates described with the aid of FIGS. 1, 2 and 3 are a degenerate form of the general class of networks now being described, and one may be misled by looking at them into believing the rule for constructing more elaborate switching networks is to insert in series with each parallelly connected logic FET a GIMOS FET of similar conductivity type and in parallel with each serially connected logic FET a GIMOS FET of similar conductivity type, and to connect the gates of the GIMOS FET pairs similarly to the pairs of logic FET's which they control. The actual rule is somewhat more complex.

The GIMOS FET's are not associated with just the logic FET's on a corresponding basis, but rather are associated on a corresponding basis with both the logic FET's and the network branches in which they are located. This leads to the following three rules for generating the programmable logic array from the COS/MOS circuit used to realize the most complex logic equation.

RULE I: Each logic FET *and parallel combination of circuit branches* that is in series with a logic FET or parallel combination of circuit branches should be paralleled by a programmable-$V_T$ FET for programming purposes.

RULE II: Each logic FET *and series combination of circuit branches* that is to be in parallel connection with a logic FET or series combination of circuit branches should be serially connected with a programmable-$V_T$ FET for programming and the resulting series connections paralleled instead.

RULE III: The gates of the programmable-$V_T$FET's that are duals, insofar as admittance and impedance in their respective networks selectively connecting terminal OUT to respective ones of V+ and V− terminals are concerned, are connected together to receive programming voltage on the same line.

In converting FIG. 4 into FIG. 5 according to these rules, P41 and P51 are each in series connection with another FET (i.e., each other), so are paralleled by p-channel GIMOS FET's P42 and P52 respectively. N41 and N51 are each in parallel connection with another FET (i.e., each other), so are put into series connection with p-channel GIMOS FET's N42 and N52, respectively, which series connections are then paralleled. P42 and N42 are duals, P42 being a series impedance element and N42 a parallel conductance element, so their gates are interconnected to the same programming line running to terminal PR4. Similarly, P52 and N52 are duals and their gates are interconnected to the same programming line and to terminal PR5.

The series connection of P41 and P51 in FIG. 4 is in parallel connection with FET P61, calling into operation Rule II, that instructs the insertion of a p-channel GIMOS FET P82 in series with the series connection of P41 and P51 and the insertion of a p-channel GIMOS FET P62 in series with FET P61, in FIG. 5. The parallel connection of N41 and N51 in FIG. 4 is in series connection with FET N61, so according to Rule I n-channel GIMOS FET N82 is paralleled with the parallel connection and n-channel GIMOS FET N62 is parallelled with N61. P62 and N62 are duals so their gates are interconnected to the same programming line and to terminal PR6. P82 and N82 are duals with gates connected to terminal PR8.

P71 is in series with the parallel connection of the other p-channel FET's described above, so they are paralleled with p-channel GIMOS FET's P72 and P92, respectively. In FIG. 4, N71 parallels the serial connection of the other n-channel FET's decribed above, so they are serially connected in FIG. 5 with n-channel GIMOS FET's N72 and N92, respectively, before being paralleled. P72 and N72 are duals with gates connected to terminal PR7, and P92 and N92 are duals with gates connected to terminal PR9.

As thusfar described, the programmable logic array requires six programming lines accessed by programming terminals PR4, PR5, PR6, PR7, PR8 and PR9. It is desirable to reduce the number of programming lines required in an array—if possible, to the same number as there are logic input terminals—so the programming lines may be accessed through the logic input terminals without need for separate programming terminals. A first step is to look for programming redundancies; and sometimes, particularly in simpler arrays, this can be done by inspection. Looking at FIG. 5, for example, it is clear P92 and N92 are not needed. The short-circuiting provided by P92 can be carried out by P42, P52 and P82 being simultaneously conductive. The open-circuiting provided by N92 can be carried out by N42, N52 and N82 being simultaneously non-conductive.

Some thought will lead one to the conclusion that the superfluity of P92 and N92 illustrates that RULES I and II for generating the programmed logic array are a little more general than need be. There are two corollaries to RULES I and II, following, which, if simultaneously applied, avoid the need for subsequent reduction of the logic array.

COROLLARY TO RULE I: Rule I is not applied for series connections of a plurality of parallel combinations.

COROLLARY TO RULE 11: Rule II is not applied for parallel connections of a plurality of serial combinations.

The second step in reduction of the number of lines for programming the network is made reflective of the reasons that P82 and N82 had to be inserted into the FIG. 5 network. P82 is inserted to avoid short-circuiting the branch containing P61, P62 when P42 and P52 are both programmed conductive; and N82 is inserted to avoid open-circuiting the source of N61 and N42 and N52 are both programmed to be non-conductive. The programming condition that causes difficulty is the application of "lows" to the interconnected gates of P42, N42 and to the interconnected gates of P52, N52. If P82 could be replaced by a programmable logic gate that would be rendered non-conductive for only this programming condition, and if N82 could be replaced by a programmable logic gate that would be rendered conductive for only this programming condition, these two logic gates replacing P82 and N82 could be programmed from the same lines as P42, N42 and P52, N52. A programmable OR gate in negative-logic—i.e., two paralleled n-channel GIMOS FET's N84 and N85—is the suitable replacement for P82. A programmable NAND gate in negative-logic—i.e., two serially connected p-channel GIMOS FET's P84 and P85—is the suitable replacement for N82.

Figure 6:
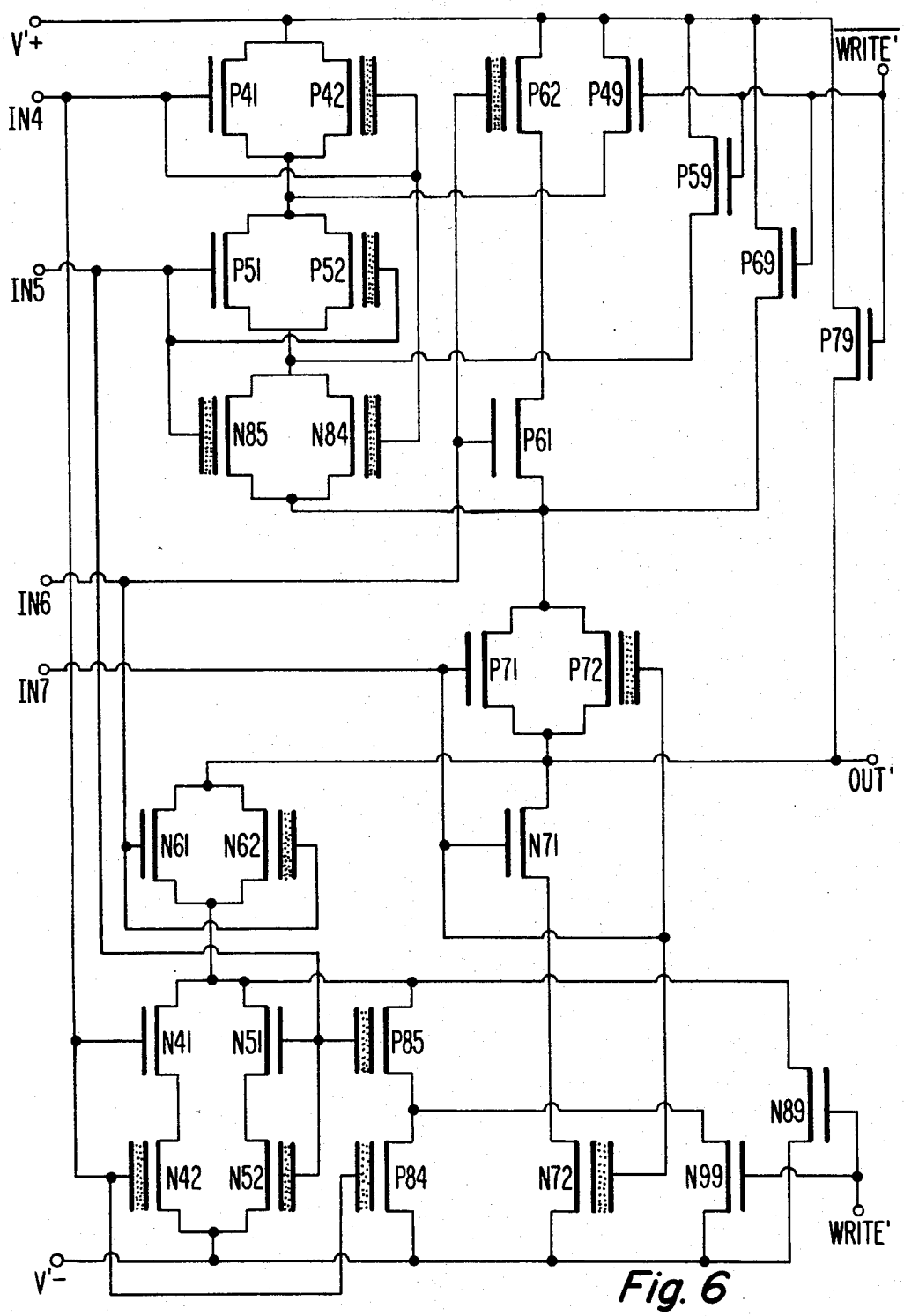

FIG. 6 shows the resulting programmable logic network, with the programming lines brought out to terminals PR4, PR5, PR6, PR7 in FIG. 4 now brought out to logic input terminals IN4, IN5, IN6, IN7 instead. During programming, p-channel FET's P49, P59, P69, P79 clamp the nodes, to which their drains respectively connect, to V′+ terminal responsive to a voltage pulse applied to terminal $\overline{WRITE0}$ /. This pulse is negative respective to the voltage at terminal V+ by an amount greater than the $V_T$'s of P49, P59, P69, P79. During programming, n-channel FET's N89 and N99 clamp the nodes to which their drains respectively connect to V′− terminal responsive to a voltage pulse applied to terminal WRITE'. This pulse is positive-going respective to the voltage at terminal V′− by an amount greater than the $V_T$'s of N89, N99. FIG. 7 shows the FIG. 6 programmable logic network modified to replace N41 and N42 by a single n-channel FET N43 with one long wired gate and one short floating gate, to replace N51 and N52 by a single n-channel FET N53 with one long wired gate and one short floating gate, to replace P61 and P62 by a single p-channel FET P63 with one long wired gate and one short floating gate, and to replace N71 and N72 by a single n-channel FET N73 with one long wired gate and one short floating gate.

The programmable logic available from the logic networks of FIGS. 6 and 7 is tabulated below. The programming code comprises $V_{42}$, $V_{52}$, $V_{62}$ and $V_{72}$ as bits. $V_{42}$, $V_{52}$, $V_{62}$ and $V_{72}$ are the programming voltages applied respectively to IN4, IN5, IN6 and IN7 logic input terminals. "One" in the programming code indicates the previous respective programming voltage $V_{42}$, $V_{52}$ or $V_{72}$ was "low"; "zero," that it was "high." In the case of $V_{62}$ a "one" in the programming code indicates the previous programming voltage was "high"; "zero", that it was "low."

| PROGRAMMING CODE $\overline{V}_{42}$-$\overline{V}_{52}$-$V_{62}$-$\overline{V}_{72}$ | SHORT-CIRCUIT GIMOS FET's | OPEN-CIRCUIT GIMOS FET's | LOGIC Equation |
|---|---|---|---|
| 0000 | N42,N52,P62,N72, N84,N85 | P42,P52,N62,P72 P84,P85 | $T_0 = \overline{I_7 + [I_6 \cdot (I_5 + I_4)]}$ |
| 0001 | N42,N52,P62,N72 N84,N85 | P42,P52,N62,P72 P84,P85 | $T_1 = \overline{I_6 \cdot (I_5 + I_4)}$ |
| 0010 | N42,N52,N62,N72 N84,N85 | P42,P52,P62,P72 P84,P85 | $T_2 = \overline{I_7 + I_5 + I_4}$ |
| 0011 | N42,N52,N62,P72 N84,N85 | P42,P52,P62,N72 P84,P85 | $T_3 = \overline{I_5 + I_4}$ |
| 0100 | N42,P52,P62,N72 N84,P85 | P42,N52,N62,P72 P84,N85 | $T_4 = \overline{I_7 + (I_6 \cdot I_4)}$ |
| 0101 | N42,P52,P62,P72 N84,P85 | P42,N52,N62,N72 P84,N85 | $T_5 = \overline{I_6 \cdot I_4}$ |
| 0110 | N42,P52,N62,N72 N84,P85 | P42,N52,P62,P72 P84,N85 | $T_6 = \overline{I_7 + I_4}$ |
| 0111 | N42,P52,N62,P72 N84,P85 | P42,N52,P62,N72 P84,N85 | $T_7 = \overline{I_4}$ |
| 1000 | N42,N52,P62,N72 P84,N85 | N42,P52,N62,P72 N84,P85 | $T_8 = \overline{I_7 + (I_6 \cdot I_5)}$ |
| 1001 | P42,N52,P62,P72 P84,N85 | N42,P52,N62,N72 N84,P85 | $T_9 = \overline{(I_6 \cdot I_5)}$ |
| 1010 | P42,N52,N62,N72 P84,N85 | N42,P52,P62,P72 N84,P85 | $T_{10} = \overline{I_7 + I_5}$ |
| 1011 | P42,N52,N62,P72 P84,N85 | N42,P52,P62,P72 N84,P85 | $T_{11} = \overline{I_5}$ |
| 1100 | P42,P52,P62,N72 P84,P85 | N42,N52,N62,P72 N84,N85 | $T_{12} = \overline{I_7 + I_6}$ |

-continued

| PROGRAMMING CODE $\overline{V}_{42}\text{-}\overline{V}_{52}\text{-}V_{62}\text{-}\overline{V}_{72}$ | SHORT-CIRCUIT GIMOS FET's | OPEN-CIRCUIT GIMOS FET's | LOGIC Equation |
|---|---|---|---|
| 1101 | P42,P52,P62,P72 P84,P85 | N42,N52,N62,N72 N84,N85 | $T_{13} = \overline{I_6}$ |
| 1110 | P42,P52,N62,N72 P84,P85 | N42,N52,P62,P72 N84,N85 | $T_{14} = \overline{I_7}$ |
| 1111 | P42,P52,N62,P72 P84,P85 | N42,N52,P62,N72 N84,N85 | $T_{15} = 0$ |

If one skilled in the art of logic design examines the various programmed logic statements that can be derived from $T_0$, he will be provided with the experience necessary to select a $T_0$ of sufficient generality to obtain all programmed logic statements he requires. In a nutshell, $T_0$ should be chosen such that omission of selected logic inputs from $T_0$ will generate all logic statements one desires to program.

The principles set forth in connection with the design of the FIGS. 6 and 7 programmable logic networks can be extended to still more complex programmable logic networks, there being an increase in the complexity of the programmable logic gates used to prevent the simultaneous programming-out of a plurality of unwanted logic variables and to avoid also incidentally and undesirably programming-out a wanted logic variable.

Note that in any of the circuitry thusfar described the tight clamping of source and drain voltages in the GIMOS FET's when they are programmed for conduction is advantageously used. It is this property which keeps the programmable-conduction devices from inserting offset voltages that would interfere with the complementary symmetry of the conduction characteristics of the fixed-$V_T$ logic FET's. The programmable-$V_T$ GIMOS FET's introduce no substantial change into the noise immunity properties of COSMOS logic gates or arrays. That is, the intermediate voltage levels at which the p-channel and n-channel COS/MOS FET's exchange principal conduction role is not substantially affected by the programmable-$V_T$ FET's, so complementary symmetry of conduction characteristics can be maintained by proven semiconductor manufacturing processes.

Attention is directed back to the programmable OR gate comprising n-channel GIMOS FET's N84 and N85, which is of particular interest in a couple of regards. One thing that is unusual is that the GIMOS FET's—though operated as logic, rather than linear, devices—are used in their source-follower mode. This is normally not done with the nonprogrammable FET's in COS/MOS logic circuitry because the source-to-gate offset voltage, or $V_{GS}$, that must be maintained to keep the enhancement-mode FET's conductive prevents their sources being clamped to their drains, thus preventing the logic output terminal from being pulled to the supply voltage. But the GIMOS FET's when programmed for conduction are conditioned to operate as depletion-mode transistors. The floating gate potentials of N84 and N85 remain, after programming for conduction, much more positive than the positive supply voltage at terminal V+ and allow their sources to be clamped to their drains.

This phenomenon can be exploited in another way in the programmable logic gates and networks. It permits the channels of an n-channel and p-channel pair of programmable-$V_T$ FET's with interconnected gates to be swapped in position in the network, affecting programmability in that there is a reversal of the polarity of the programming voltage that must be applied to achieve a certain program. Also, the V'+ and V'− voltages tend to buck, rather than aid, the programming voltage; so the programming voltage amplitude may have to be increased somewhat if the V'+ and V'− terminals are not connected to a common reference voltage during programming. However, where two different logic outputs are to be simultaneously programmed from shared input terminals or programming lines, the bucking technique can be usefully employed to selectively program one of the logic outputs. The other unusual thing about the OR-gate connection of FET's N84 and N85 is that it is a programmable switch that solely of itself performs a logic function on the programming instructions, being programmable responsive to a plurality of inputs, rather than a single input. Observations can be made concerning the programmable NAND gate comprising p-channel GIMOS FET's P84 and P85 of nature similar to the observations made first above concerning the programmable OR gate comprising n-channel GIMOS FET's N84 and N85.

FIG. 8 shows the OR gate connection of n-channel GIMOS FET's N84 and N85 replaced by a connection of p-channel SIMOS FET's P86 and P87, and it shows the NAND gate connection of p-channel GIMOS FET's P84 and P85 replaced by a connection of n-channel SIMOS FET's N86 and N87. This can be done when processing accommodates the making of both GIMOS and SIMOS transistors in the same monolithic integrated circuit. P86 and P87 can share the same substrate as the p-channel devices P41, P42, P49, P51, P52, P59, P63, P69, P71, P72, P79 they are amongst. In the case of the conventional COS/MOS manufacturing process p-channel devices P86 and P87 can be formed on the n-type i-c substrate, rather than having to have p-type isolation wells as the n-channel devices N84 and N85 they replace would have to have. N86 and N87 can share the same substrate as the n-channel devices N43, N53, N61, N62, N73, N89, N99 they are amongst. That is, in the case of the conventional COS/MOS manufacturing process on n-type i-c substrate, n-channel devices N86 and N87 can share the same p-well as the n-channel devices N43, N53, N61, N62, N73, N89, N99. Placing the p-channel devices all on one substrate and placing the n-channel devices all on one substrate make the integrated-circuit layout more compact.

A more significant advantage of the FIG. 8 configuration, perhaps, is that P86, P87, N86 and N87 tend to operate in common-source, rather than source-follower, mode. This makes it easier for the logic output terminal OUT' to be brought close to V+' operating potential, responsive to inputs I4 and I5 to terminals IN4 and IN5 being high, and to be brought close to V−' operating potential responsive to I$_4$ and I$_5$ being low.

As noted earlier in the specification, SIMOS transistors can be used in place of GIMOS transistors as programmable-V$_T$ FET's, with a reversal of the programmed responses to programming voltages of a given set of senses of polarity. FIGS. 9, 10, 11, 12, 13, 14 and 15 show the results of such replacements in the circuits of FIGS. 1, 2, 3, 5, 6, 7 and 8 respectively. The SIMOS transistors are identified by the identification alphanumerics of the GIMOS transistor they replace followed by primes.

As noted above, a number of the programmable subcombinations used in the circuits of FIGS. 1–3 and 5–15 are useful of themselves or in circuits other than those shown. The logic circuits specifically described above are COS/MOS logic circuits which comprise component logic circuits between a logic output terminal and two operating supply voltage terminals, which component logic circuits are impedance/admittance duals of each other. The component logic circuit between the logic output terminal and the more negative operating supply voltage terminal can be replaced by a pull-down resistor or current generator where complementary symmetry design is not to be used. Alternatively, where complementary symmetry is used, the component logic circuit between the logic output terminal and the more positive operating supply voltage terminal can be replaced by a pull-up resistor or current generator. The component logic circuits themselves as subcombinations are, then, an aspect of the invention.

GIMOS or SIMOS FET's with channels in series or parallel connection provide programmable switches that have a logic response to a plurality of programming voltages, as has been discussed in connection with the combinations of N84 and N85, of P84 and P85, of P86 and P87, and of N86 and N87, by way of example. These programmable switches are useful, not only in programmable logic arrays, but in other circuitry as well. For example, these programmable switches may be used to replace simpler FET switches in current mirror amplifiers with current gains programmed by selective connections through switches, as described in U.S. Pat. No. 4,064,506 issued to J. M. Cartwright, Jr., Dec. 20, 1977 and entitled "CURRENT MIRROR AMPLIFIERS WITH PROGRAMMABLE CURRENT GAINS." These switches can be used to control arithmetic operations (multiplying, dividing, root-taking, raising to a power, etc.) carried out using the logarithmic properties of bipolar transistors, too, as a further example of their use.

In the following claims, while the FET's are individually claimed, it is intended that the claims include within their scope those situations where two FET's share channel and wired-gate structures.

The phrase "gate-injection type or its like" in certain of the claims following refers to programmable-V$_T$ FET's of the polysilicon-injection type as well as those of the gate-injection type.

What is claimed is:

1. A method for providing electrically erasable, electrically programmable logic circuitry comprising the steps of:

making connections for at least one logic output terminal to each of two supply voltage terminals, at least one of said connections being a selectively made connection through the principal current conduction paths of respective transistors, said selectively made connection including the principal current conduction paths of a plurality of switching transistors, each of which paths during a time period of normal operation is switched into conduction or non-conduction responsive to signal applied from a respective logic input terminal to the control electrode of the corresponding switching transistor, and including the channel of at least one programmable-threshold-voltage (or prgrammable-V$_T$) field effect transistor, and applying for a time previous to said time period of normal operation a programming voltage to each said programmable-V$_T$ field effect transistor for conditioning it to be in a selected one of two states continuously during said time period of normal operation thereafter, either the state where it is so strongly conditioned for depletion-mode operation its channel functions as a short-circuit or the state where it is so strongly conditioned for enhancement-mode operation its channel functions as an open-circuit.

2. A method for providing electrically erasable, electrically programmable logic circuitry comprising the steps of:

making connections for at least one logic output terminal to each of two supply voltage terminals, at least one of said connections being a selectively made connection through the principal current conduction paths of respective transistors, said selectively made connection including the principal current conduction paths of a plurality of switching transistors, each of which paths during a time period of normal operation is switched into conduction or non-conduction responsive to signal applied from a respective logic input terminal to the control electrode of the corresponding switching transistor, and including the channel of at least one programmable-threshold-voltage (or programmable-V$_T$) field effect transistor; and applying for a time previous to said time period of normal operation a programming voltage to each said programmable-V$_T$ field effect transistor for conditioning it to be in a selected one of two states continuously during said time period of normal operation thereafter, either the state where it is so strongly conditioned for depletion-mode operation its channel functions as a short-circuit or the state where it is so strongly conditioned for enhancement-mode operation its channel functions as an open-circuit; wherein the step of applying programming voltage includes applying programming voltage to the gate electrode of each said programmable-V$_T$ field effect transistor through one of said logic input terminals, and applying a reference voltage to the substrate and to the drain and source electrodes of each of said programmable-V$_T$ field effect transistors.

3. A method for providing electrically erasable, electrically programmable logic circuitry comprising the steps of:

making selective connections of at least one logic output terminal to each of first and second supply voltage terminals at different times during a period of normal operation through the principal current conduction paths of respective transistors, each selective connection including the principal conduction paths of respective switching transistors switched into conduction or non-conduction responsive to signals applied from logic input terminals to their control electrodes outside their principal conduction paths, and each selective connection including the channels of respective programmable-threshold-voltage (or programmable-$V_T$) field effect transistors; and applying, for a time previous to said period of normal operation, at least one programming voltage to both of a respective pair of said programmable-$V_T$ field effect transistors, one being in the selective connection of a said logic output terminal to said first supply voltage terminal and the other being in the selective connection of that logic output terminal to said second supply voltage terminal, for so strongly conditioning one of the pair for depletion-mode operation during the period of normal operation thereafter that its channel functions as a short-circuit and so strongly conditioning the other of the pair of enhancement-mode operation during the period of normal operation thereafter that its channel fucntions as an open-circuit.

4. A method as set forth in claim 3 wherein the step of applying, for a time previous to said period of normal operation, at least one programming voltage to both of a respective pair of programmable-$V_T$ transistors includes:

applying each programming voltage to the control gate electrodes of its respective programmable-$V_T$ transistors, and applying a reference voltage to the substrate and to the drain and source electrodes of each of those programmable-$V_T$ transistors.

5. A method as set forth in claim 3 wherein within each of said pairs of programmable-$V_T$ transistors the two programmable-$V_T$ transistors are respectively complementary conductivity types of the same sort of programmable-$V_T$ transistor.

6. A method for reducing the number of programming lines in a network comprising field effect transistors interconnected by means including first and second electrically programmable elements, said first electrically programmable element to be programmed for conduction when said second electrically programmable elements is to be programmed for non-conduction, and vice versa, for helping to make selective respective connections of a network output terminal to one of two operating voltage terminals, said method comprising the steps of:

using for said first electrically programmable element the channel of a first field effect transistor of a first conductivity type, which has a charge-injecting electrode structure, and which has in addition to its control gate electrode a floating gate between which and said charge-injecting electrode structure thereof a static charge may be placed responsive to a programming voltage applied between its control gate electrode and that charge-injecting electrode structure, for altering its threshold voltage;

using for said second electrically programmable element the channel of a second field effect transistor of a second conductivity type complementary to said first conductivity type, which has a charge-injecting electrode structure analogous to that of said first field effect transistor and which has in addition to its control gate electrode a floating gate between which and said charge-injecting electrode structure thereof a static charge may be placed responsive to a programming voltage applied between its control gate electrode and that charge-injecting electrode structure, for altering its threshold voltage and connecting the control gate electrodes of these first and second field effect transistors to the same programming line.

7. A method for reducing the number of programming lines in a network as set forth in claim 6 including the step of:

connecting the programming line to which the gate electrodes of said first and second field effect transistors connect to an input terminal for the application of signals other than threshold-voltage programming voltages to an electrode of at least one of said field effect transistors interconnected by means including a plurality of electrically programmable elements.

8. A method for eliminating the need for separate terminals specifically for application of programming signals in a network comprising field effect transistors with ones of their electrodes each connected to one of a plurality of network input terminals consecutively ordinally numbered at least first through $n^{th}$ and the others of their electrodes interconnected by means including a plurality of electrically programmable elements, a first of these electrically programmable elements to be programmed for conduction when a second of them is to be programmed for non-conduction, and vice versa, for helping to make selective respective connections of a network output terminal to one of two operating voltage terminals, said method comprising the steps of:

using for said first electrically programmable element the parallelly connected channels of a first plurality of further field effect transistors consecutively ordinally numbered first through $n^{th}$, each of which has a control gate electrode connected to the network input terminal similarly ordinally numbered and has a floating gate electrode on which an electrostatic charge may be placed responsive to a programming voltage applied to its control gate electrode; and using for said second electrically programmable element the serially connected channels of a second plurality of further field effect transistors consecutively ordinally numbered first through $n^{th}$, each of which has a control gate electrode connected to the network input terminal similarly ordinally numbered and has a floating gate electrode on which an electrostatic charge may be placed responsive to a programming voltage applied to its control gate electrode.

9. A method for programmably providing either a conductive or a selectively conductive path between first and second nodes, using between said first and second nodes a programmable element comprising:

an input terminal for receiving control signal voltages in a normal operating range or programming voltages outside said normal operating range;

a first field effect transistor having a gate electrode connected to said input terminal, being of a type having a threshold voltage alterable responsive to programming voltages received at its gate electrode, and having a channel with first and second ends respectively connected at said first node and at said second node; and a second field effect transistor having a gate electrode connected to said input terminal, being of a type having a threshold voltage characteristic unaffected after application of programming voltages via said input terminal to the gate of said first field effect transistor, and having a channel with first and second ends respectively connected at said first node and at said second node, which method further includes the alternative steps of:

applying a programming voltage of a first sense to said input terminal, which programming voltage is of an amplitude large enough to condition said first transistor to be so strongly depletion-mode in its conduction characteristic that its channel is conductive for all control signals in said normal operating range applied to its gate electrode, whereby said conductive path is continuously provided between said first and second nodes by the channel of said first transistor bypassing the channel of said second transistor until the conduction characteristic of said first transistor is changed by re-programming; and applying a programming voltage of a second sense opposite to the first sense to said input terminal, which programming voltage is of an amplitude large enough to condition said first transistor to be so strongly enhancement-mode in its conduction characteristic that its channel is non-conductive for all control signals in said normal operating range applied to its gate electrode, whereby the selectively conductive path between said first and second nodes is provided solely through the channel of said second transistor, until the conduction characteristic of said first transistor is changed by re-programming.

10. A programmable element for use as the programmable element in the method set forth in claim 9 wherein said first field effect transistor is a floating gate field effect transistor of gate-injection type.

11. A programmable element for use as the programmable element in the method set forth in claim 9 wherein said first field effect transistor is a floating gate field effect transistor of substrate-injection type.

12. The method of claim 9 used with each of a plurality of programmable elements having their said paths in serial connection.

13. A method for programmably providing either a selectively conductive path or no path for conduction between first and second nodes, using between said first and second nodes a programmable element comprising:

an input terminal for receiving control signal voltages in a normal operating range or programming voltages outside said normal operating range;

a first field effect transistor having a gate electrode connected to said input terminal, being of a type having a threshold voltage alterable responsive to programming voltages received at its gate electrode, and having a channel with first and second ends, its first end being connected to said first node;

a second field effect transistor having a gate electrode connected to said input terminal, being of a type having a threshold voltage characteristic unaffected after application of programming voltages via said input terminal to the gate of said first field effect transistor, and having a channel with first and second ends, its first end being connected to the second end of the channel of said first field effect transistor, and its second end being connected to said second node, which method invariably leaves said first field effect transistor with its channel conditioned to function either as an effective open-circuit or as an effective short circuit for the channel current of said second transistor as tends to flow in response to control signal voltages in said normal operating range, to cause the conduction characteristics of said selectively conductive path to be essentially attributable to the conduction characteristics of said second transistor rather than to those of said first transistor, and which method accordingly comprises the alternative steps of:

applying a programming voltage of a first sense to said input terminal, which programming voltage is of an amplitude large enough to condition said first transistor to be so strongly depletion-mode in its conduction characteristics that its channel is conductive for all control signals in said normal operating range applied to its gate electrode, whereby said selectively conductive path is provided between said first and second nodes through the channels of said first and second transistors until the conduction characteristic of said first transistor is changed by re-programming; and applying a programming voltage of a second sense opposite to the first sense to said input terminal, which programming voltage is of an amplitude large enough to condition said first transistor to be so strongly enhancement-mode in its conduction characteristics that its channel is non-conductive for all control signals in said normal operating range applied to its gate electrode, whereby said first transistor interrupts conduction between said first and second nodes until its conduction characteristic is changed by re-programming.

14. A programmable element for use as the programmable element in the method set forth in claim 13 wherein said first field effect transistor is a floating gate field effect transistor of gate-injection type.

15. A programmable element for use as the programmable element in the method set forth in claim 13 wherein said first field effect transistor is a floating gate field effect transistor of substrate-injection type.

16. The method of claim 13 used with each of a plurality of programmable elements with their selectively conductive paths paralleled.

17. A programmable gate for providing a selected type of controlled conduction between first and second nodes, said programmable gate comprising:

a plurality, n in number, of input terminals, for receiving conduction controlling signals within a prescribed range during a period of normal operation, and for receiving selection signals outside said prescribed range during a programming interval previous to said period of normal operation, which selection signals select the type of controlled conduction provided in the following said period of normal operation;

a first plurality, n in number, of field effect transistors having respective gate electrodes connected to respective ones of said input terminals, having threshold voltages unaffected by signals within said prescribed range but electrically alterable responsive to programming voltages applied to their gates via said input terminals, and having respective channels in a series connection between said first and second nodes for selecting the type of controlled conduction between said first and second nodes, dependent on whether selection signals last applied to the gate electrodes of the field effect transistors in said first plurality have rendered each sufficiently depletion-mode in conduction characteristic that its channel is conductive under all conduction controlling signal conditions as obtain during said period of normal operation or sufficiently enhancement-mode in conduction characteristic that its channel is non-conductive under all conduction controlling signal conditions as obtain during said period of normal operation; and a second plurality, n in number, of field effect transistors having respective gate electrodes connected to respective ones of said input terminals, having threshold voltage characteristics unaffected by signals within said prescribed range and programming voltages outside said prescribed range applied via said input terminals, and having respective channels in parallel connections with respective ones of the channels of said first plurality of field effect transistors, the channels of field effect transistors in said second plurality parallelled by non-conductive channels of field effect transistors in said first plurality providing control of the conduction between said first and second nodes responsive to the conduction controlling signals received at the input terminals connected to the gate electrodes of those field effect transistors in said second plurality.

18. A programmable gate for selectively providing conduction between first and second nodes as a programmably selected one of a set of OR responses to logic signals, said programmable gate comprising:

a plurality, n in number, of input terminals;

a first plurality, n in number, of field effect transistors having respective gate electrodes connected to respective ones of said input terminals, having respective channels the first ends of which connect to said first node, and having threshold voltages electrically alterable responsive to programming voltages applied to their gates via said input terminals, for conditioning each of their channels either to be conductive for all logic signal levels or to be non-conductive for all logic signal levels until possible reprogramming;

a second plurality, n in number, of field effect transistors having respective gate electrodes connected to respective ones of said input terminals, having threshold voltage characteristics unaffected after application of programming voltage via said input terminals, and having respective channels connected at their first ends to respective ones of the second ends of the channels of said first plurality of field effect transistors and connected at their second ends to said second node; and means for applying logic signals to said input terminals connecting to those of said second plurality of field effect transistors having their channels in series connection with the channels of those of said first plurality of field effect transistors conditioned to be conductive for all logic signals, the application of said logic signals being made following application of programming voltages, said logic signals being apt to be at times such as to simultaneously condition more than one of said second plurality of field effect transistors to complete a respective conduction path between first and second nodes.

19. A programmable gate with selectively conductive current conduction path between first and second nodes, said programmable gate comprising:

a plurality, n in number, of input terminals for logic voltages in a normal range of logic levels and for programming voltages outside said normal range;

a first plurality, n in number, of field effect transistors of a first conductivity type, having respective gates connected to respective ones of said input terminals, having threshold voltage characteristics unaffected by logic or by programming voltages received at their gates, and having respective channels;

a second plurality, n in number, of field effect transistors of said first conductivity type, having respective gates connected to respective ones of said input terminals, having threshold voltages electrically alterable responsive to programming voltages but not to logic voltages received at their gates from respective ones of said input terminals, and having respective channels connected in respective parallel combinations with respective ones of the channels of field effect transistors in said first plurality; and programmable switch means having a selectively conductive path therethrough for selectively completing a serial connection of said parallel combinations between said first and second nodes, said path being programmed for non-conduction only in response to programming voltages at said input terminals being such as to alter the threshold voltages all of said second plurality of transistors to thereafter condition their channels for simultaneous conduction irrespective of logic voltages.

20. A programmable gate as set forth in claim 19 wherein said programmable switch means comprises:

a third plurality, n in number, of field effect transistors of a second conductivity type complementary to the first, having respective gates connected to respective ones of said input terminals, having threshold voltages electrically alterable responsive to programming voltages but not to logic voltages received at their gates, and having respective channels in a parallel connection to provide the selectively conductive path through said programmable switch means.

21. A programmable gate as set forth in claim 19 wherein said programmable switch means comprises:

a third plurality, n in number, of field effect transistors of said first conductivity type, one of said second and third pluralities of field effect transistors being comprised of floating gate transistors of gate-injection type or its like and the other being comprised of floating gate transistors of substrate-injection type, the field effect transistors in said third plurality having respective gates connected to respective ones of said input terminals and having respective channels in a parallel connection to provide the selectively conductive path through said programmable switch means.

22. A programmable gate with selectively conductive current conduction path between first and second nodes, said programmable gate comprising:

a plurality, n in number, of input terminals for logic voltages in a normal range of logic levels and for programming voltages outside said normal range;

a first plurality, n in number, of field effect transistors of a first conductivity type having respective gates connected to respective ones of said input terminals, having threshold voltage characteristics unaffected by logic or programming voltages received at their gates, and having respective channels connected at their first ends to said first node the conductivity of which channels is controlled by the logic voltages received at their gates;

a second plurality, n in number, of field effect transistors of said first conductivity type, having respective gates connected to respective ones of said input terminals, having threshold voltages electrically alterable responsive to programming voltages but not to logic voltages received at their gates, and having respective channels connected at their first ends to respective ones of the second ends of the channels of field effect transistors in said first plurality and connected at their second ends to said second node; and programmable switch means having a selectively conductive path therethrough for selectively connecting said first and second nodes, said path being programmed for conduction only in response to programming voltages at said input terminals being such as to alter the threshold voltages of all of said second plurality of transistors to thereafter condition their channels for simultaneous non-conduction irrespective of logic voltages.

23. A programmable gate as set forth in claim 22 wherein said programmable switch means comprises:
a third plurality, n in number, of field effect transistors of a second conductivity type complementary to the first, having respective gates connected to respective ones of said input terminals, having threshold voltages electrically alterable responsive to programming voltages but not to logic voltages received at their gates, and having respective channels in a series connection between said first and second nodes to provide the selectively conductive path through said programmable switch means.

24. A programmable gate as set forth in claim 22 wherein said programmable switch means comprises:
a third plurality, n in number, of field effect transistors of said first conductivity type, one of said second and third pluralities of field effect transistors being comprised of floating gate transistors of gate-injection type or its like and the other being comprised of floating gate transistors of substrate-injection type, the field effect transistors in said third plurality having respective gates connected to respective ones of said input terminals and having respective channels in a series connection between said first and second nodes to provide the selectively conductive path through said programmable switch means.

25. A COS/MOS logic array having first and second supply voltage terminals; a multiplicity m of logic input terminals consecutively ordinally numbered first through $m^{th}$; at least one logic output terminal; a multiplicity m of n-channel logic FET's associated with each logic output terminal, being consecutively ordinally numbered first through $m^{th}$, having channels arranged with intervening nodal connections in a first network of series and parallel branches for selectively connecting the logic output terminal associated therewith to said first supply voltage terminal, and having gates connected to the ones of said logic input terminals having the same ordinal numbers as their own; and a multiplicity m of p-channel logic FET's associated with each logic output terminal, being consecutively ordinally numbered first through $m^{th}$, having channels arranged with intervening nodal connections in a second network of series and parallel branches for selectively connecting the logic output terminal associated therewith to said second supply voltage terminal, said first and second networks being duals of each other insofar as impedance and admittance are concerned, and having gates connected to the ones of said logic input terminals having the same ordinal numbers as their own—said COS/MOS logic array modified by inclusion of programmable switch elements each electrically programmable either to be essentially conductive or to be essentially non-conductive over the range of normal logic levels; said programmable switch elements being connected so that:

a respective programmable switch element parallels the channel of each logic FET that is serially connected with another logic FET, the channel of each logic FET that is serially connected with a parallel combination of circuit branches, and each parallel combination of circuit branches that is serially connected with a logic FET; and a respective programmable switch element is interposed in series with the channel of each logic FET that is parallelly connected with another logic FET, the channel of each logic FET that is parallelly connected with a series combination of circuit branches, and each series combination of circuit branches that is parallelly connected with a logic FET.

26. A modified COS/MOS logic array as set forth in claim 25 wherein each programmable switch element has a switched path therethrough through the channel of at least one programmable-conduction field effect transistor contained within no other programmable switch element, each said field effect transistor having a gate connected to any one of said logic input terminals and being of a type electrically programmable to be relatively depletion-mode in its characteristic and thereby essentially conductive over the range of normal logic levels, or to be relatively enhancement-mode in its characteristic and thereby essentially non-conductive over the range of normal logic levels.

27. A modified COS/MOS logic array as set forth in claim 25, wherein each programmable switch element has a switched path therethrough the channel of at least one gate-injection MOSFET comprised solely within that programmable switch element and wherein means are provided for applying at selected times programming voltage between the gate and at least one of the source and drain of each gate-injection MOSFET.

28. A modified COS/MOS logic array as set forth in claim 27 wherein each pair of gate-injection MOSFET's, one connected into said first network and the other connected into said second network, that are duals of each other insofar as impedance and admittance are concerned, are of complementary conductivity types and have their gates interconnected for receiving programming voltages.

29. A modified COS/MOS logic array as set forth in claim 25, wherein each programmable switch element has a switched path therethrough through the channel of at least one substrate-injection MOSFET comprised solely within that programmable switch element and wherein means are provided for applying at selected times programming voltage between the gate and the substrate of each substrate-injection MOSFET.

30. A modified COS/MOS logic array as set forth in claim 29 wherein each pair of substrate-injection MOSFET's, one connected into said first network and the other connected into said second network, that are duals of each other insofar as impedance and admittance are concerned, are of complementary conductivity types and have their gates interconnected for receiving programming voltages.

31. A programmable logic gate comprising:
first and second field effect transistors of a first conductivity type and third and fourth field effect transistors of a second conductivity type complementary to the first, said transistors having respective channels the ends of which are defined by respective source and drain electrodes and having respective gate electrodes;
fifth, sixth, seventh and eighth field effect transistors with programmable threshold voltages, having respective channels the ends of which are defined by respective source and drain electrodes and having respective gate electrodes for receiving programming voltages;
first and second supply voltage terminals;
a first input terminal connected to the gate electrodes of said first and third transistors;
a second input terminal connected to the gate electrodes of said second and fourth transistors;
an output terminal, between which and said first supply voltage terminal there is a series connection including the channels of said first and fifth transistors and a series connection including the channels of said second and sixth transistors, and between which and said second supply voltage terminal there is a series connection including the parallelled channels of said third and seventh transistors and including the parallelled channels of said fourth and eighth transistors;
means for applying respective programming voltages between the gate electrodes of said fifth and seventh transistors and appropriate others of their electrodes to condition the channel of one to be conductive and the channel of the other non-conductive; and
means for applying respective programming voltages between the gate electrodes of said sixth and eighth transistors and appropriate others of their electrodes to condition the channel of one to be conductive and the channel of the other to be non-conductive.

32. A programmable logic gate as set forth in claim 31 wherein said fifth and seventh transistors have an interconnection between their gate electrodes and are of types programmable one for conduction and the other for non-conduction responsive to their gate potentials being of the same sense.

33. A programmable logic gate as set forth in claim 32 wherein the interconnection between the gate electrodes of said fifth and seven transistors has connected to it one of said first and second input terminals.

34. A programmable logic gate as set forth in claim 33 wherein said fifth and seventh transistors are floating gate transistors of gate-injection type and, are of complementary conductivity types, and wherein each has as its other electrode at least one of its source and drain electrodes.

35. A programmable logic gate as set forth in claim 33 wherein said fifth and seventh transistors are floating gate transistors of substrate-injection type and are of complementary conductivity types, and wherein each has as its other electrode its substrate electrode.

36. A programmable logic gate as set forth in claim 32 wherein said sixth and eighth transistors have an interconnection between their gate electrodes and are of types programmable one for conduction and the other for non-conduction responsive to their gate potentials being of the same sense.

37. A programmable logic gate as set forth in claim 36 wherein the interconnection between the gate electrodes of said fifth and seventh transistors is at one of said first and second input terminals and the interconnection between the gate electrodes of said sixth and eighth transistors is at the other of said first and second terminals.

38. A programmable logic gate comprising: first, second, third, and fourth field effect transistors of a first conductivity type and
fifth, sixth, seventh and eighth field effect transistors of a second conductivity type complementary to said first conductivity type, each of said transistors having a respective source, respective drain and respective gate, and requiring a threshold potential between its source and gate be exceeded before it exhibits substantial conduction between its source and drain, the threshold potentials of said even-numbered transistors being substantially fixed in level and the threshold potential of each of said odd-numbered transistors being electrically alterable by application of potential between its gate and at least one of its source and drain;
a first supply voltage terminal to which the sources of said first and third transistors connect;
a second supply voltage terminal to which the sources of said fifth and sixth transistors connect;
a first input terminal connecting to the gates of said second and sixth transistors;
a second input terminal connecting to the gates of said fourth and eighth transistors;
an output terminal to which the drains of said second and fourth transistors connect;
a first node between the drain of said first transistor and the source of said second transistor;
a second node between the drain of said third transistor and the source of said fourth transistor;
a third node to which the drains of said fifth and sixth transistors and the sources of said seventh and eighth transistors connect;
a fourth node to which the drains of said seventh and eighth transistors connect;
means for connecting said fourth node to said output terminal at least at selected times during operation as a logic gate; and
means for selectively applying at other times respective programming potentials between the gate of each of said odd-numbered transistors and at least one of its source and drain for programming its threshold potential, including
means for applying a reference potential at said other times to said at least one of its source and drain of each of said odd-numbered transistors.

39. A programmable logic gate as set forth in claim 38 wherein the gates of said first and fifth transistors both connect to one of said first and second input terminals.

40. A programmable logic gate as set forth in claim 39 wherein the gates of said third and seventh transistors both connect to the other of said first and second input terminals.

41. A programmable logic gate comprising: first, second, third, and fourth field effect transistors of a first conductivity type and fifth, sixth, seventh and eighth field effect transistors of a second conductivity type complementary to said first conductivity type, each of said transistors having a respective source, respective drain and respective gate, having a substrate that it may share with other field effect transistors of the same conductivity type, and requiring a threshold potential between its source and gate be exceeded before it exhibits substantial conduction between its source and drain, the threshold potentials of said even-numbered transistors being substantially fixed in level and the threshold potential of each of said odd-numbered transistors being electrically alterable by application of potential between its gate and its substrate;

a first supply voltage terminal to which the sources of said first and third transistors connect;

a second supply voltage terminal to which the sources of said fifth and sixth transistors connect;

a first input terminal connecting to the gates of said second and sixth transistors;

a second input terminal connecting to the gates of said fourth and eighth transistors;

an output terminal to which the drains of said second and fourth transistors connect;

a first node between the drain of said first transistor and the source of said second transistor;

a second node between the drain of said third transistor and the source of said fourth transistor;

a third node to which the drains of said fifth and sixth transistors and the sources of said seventh and eighth transistors connect;

a fourth node to which the drains of said seventh and eighth transistors connect;

means for connecting said fourth node to said output terminal at least at selected times during operation as a logic gate; and means for selectively applying at other times respective programming potentials between the gate of each of said odd-numbered transistors and its substrate for programming its threshold potential, including means for applying a reference potential at said other times to the substrates of each of said odd-numbered transistors.

42. A programmable logic gate as set forth in claim 41 wherein the gates of said first and fifth transistors both connect to one of said first and second input terminals.

43. A programmable logic gate as set forth in claim 42 wherein the gates of said third and seventh transistors both connect to the other of said first and second input terminals.

44. A programmable logic gate comprising:

a first plurality, n in number, of floating-gate MOSFET's, consecutively ordinally numbered first through $n^{th}$, each having a respective principal current conduction path with first and second ends and having a respective control gate electrode;

a second plurality, n in number, of floating-gate MOSFET's, consecutively ordinally numbered first through $n^{th}$, each having a respective principal current conduction path with first and second ends and having a respective control gate electrode;

a plurality, n in number, of further transistors of a first conductivity type, consecutively ordinally numbered first through $n^{th}$, each having a respective principal current conduction path with first and second ends and having a respective control electrode;

a plurality, n in number, of further transistors of a second conductivity type, complementary to said first conductivity type, consecutively ordinally numbered first through $n^{th}$, each having a respective principal current conduction path with first and second ends and having a respective control electrode;

a plurality, n in number, of input terminals, consecutively ordinally numbered first through $n^{th}$, each of which input terminals connects to the control electrodes of the pair of said further transistors having ordinal numbers the same as its ordinal number;

first and second supply voltage terminals;

an output terminal;

series connections between said first supply voltage terminal and said output terminal of each of the principal current conduction paths of said floating-gate MOSFET's of said first plurality with the principal current conduction path of the one of said further transistors of said first conductivity type bearing the same ordinal number;

parallel connections of each of the principal current conduction paths of said floating-gate MOSFET's of said second plurality with the principal current conduction path of the one of said further transistors of said second conductivity type having the same ordinal number, which parallel connections are serially connected between said output terminal and said supply voltage terminal; and means selectively applying a respective programming potential between the gate electrode of each of said floating-gate MOSFET's and one of the ends of its principal current conduction path for programming that path to be relatively low resistance or relatively high resistance.

45. A programmable logic gate as set forth in claim 44 wherein said first plurality of floating gate MOSFET's are gate-injection MOSFET's of said first conductivity type; wherein the first ends of the principal current conduction paths of said gate-injection MOSFET's of first conductivity type connect to said first supply voltage terminal; wherein their control gate electrodes connect to the respective input terminals having the same ordinal number as their own to provide said means for programming the resistances of their principal current conduction paths; wherein the second ends of their principal current conduction paths connect to the first ends of the principal current conduction paths of said further transistors of said first conductivity type respectively having the same ordinal numbers as their own; and wherein the second ends of the principal current conduction paths of said further transistors of first conductivity type connect to said output terminal.

46. A programmable logic gate as set forth in claim 45 wherein said second plurality of floating gate MOSFET's are gate-injection MOSFET's of said second conductivity type, with their control gate electrodes respectively connected to the ones of said input terminals having the same ordinal number as their own; wherein the first ends of the principal current conduction paths of the first of said second plurality of gate-injection MOSFET's and of the first of said further transistors of second conductivity type connect to said second voltage supply terminal; wherein the first ends of the principal current conduction paths of the rest of the parallelled ones of said second plurality of gate-injection MOSFET's and of said further transistors of said second conductivity type having the same ordinal number connect, at respective nodes having ordinal numbers smaller by one, to the second ends of the principal current conduction paths of the parallelled ones of said second plurality of gate-injection MOSFET's and of said further transistors of said second conductivity type having ordinal numbers smaller by one; wherein the second ends of the principal current conduction paths of the $n^{th}$ ones of said second plurality of gate-injection MOSFET's and of said further transistors of said second conductivity type connect to said output terminal; and wherein there is included:
- a number n-1 of switch means, each selectively connecting the node having the same ordinal number as its own to said second supply voltage terminal during times programming potential is applied to the control gate electrode of the one of said second plurality of gate-injection MOSFET's having an ordinal number larger by one than its own.

47. A programmable logic gate as set forth in claim 44 wherein said second plurality of floating-gate MOSFET's are gate-injection MOSFET's of said second conductivity type, with their control gate electrodes respectively connected to the ones of said input terminals having the same ordinal number as their own; wherein the first ends of the principal current conduction paths of the first of said second plurality of gate-injection MOSFET's and of the first of said further transistors of second conductivity type connect to said second voltage supply terminal; wherein the first ends of the principal current conduction paths of the rest of the parallelled ones of said second plurality of gate-injection MOSFET's and of said further transistors of said second conductivity type having the same ordinal number connect, at respective nodes having ordinal numbers smaller by one, to the second ends of the principal current conduction paths of the parallelled ones of said second plurality of gate-injection MOSFET's and of said further transistors of said second conductivity type having ordinal numbers smaller by one; wherein the second ends of the principal current conduction paths of the $n^{th}$ ones of said second plurality of gate injection MOSFET's and of said further transistors of said second conductivity type connect to said output terminal; and wherein there is included:
- a number n-1 of switch means, each selectively connecting the node having the same ordinal number as its own to said second supply voltage terminal during times programming potential is applied to the control gate electrode of the one said second plurality of gate-injection MOSFET's having an ordinal number larger by one than its own.

48. A programmable logic array comprising:
first and second supply voltage terminals;
a plurality, m in number, of logic input terminals consecutively ordinally numbered first through $m^{th}$;
a logic output terminal;
a first plurality, m in number, of transistors with fixed threshold voltages, consecutively ordinally numbered first through $m^{th}$, having respective gates connected to respective logic input terminals having the same ordinal numbers as their own, and having respective channels;
a second plurality, m in number, of transistors with fixed threshold voltages, consecutively ordinally numbered m-plus-first through $2m^{th}$, having respective gates connected to respective logic input terminals having ordinal numbers smaller by m than their own, and having respective channels, each pair of said transistors with fixed thresholds having ordinal numbers differing by m being of complementary conductivity types to each other;
an even-numbered plurality, 2p in number, of transistors with programmable threshold voltages, consecutively ordinally numbered first through $2p^{th}$, having respective gates and having respective channels, the threshold voltage of each of which transistors is electrically alterable by application of a respective programming voltage to its gate;
means for applying, at selected times, programming voltages to the gates of said transistors with programmable threshold voltages;
a first network connection with intervening nodes of the channels of said first plurality of transistors with fixed threshold voltages and each of said plurality of transistors with programmable threshold voltages and with ordinal number no larger than p, for selectively connecting said output logic terminal to said first supply voltage terminal;
a second network connection with intervening nodes of the channels of said second plurality of transistors with fixed threshold voltages and each of said plurality of transistors with programmable threshold voltages and with ordinal numbers larger then p, for selectively connecting said output logic terminal to said second supply voltage terminal, said first and second network connections being duals of each other insofar as impedance and admittance characteristics of their selective connections are concerned; and
means for applying at said selected times, voltages to those of said intervening nodes in said first and second network connection as necessary to program those transistors with programmable threshold voltages.

49. A programmable logic array comprising:
first and second supply voltage terminals;
a plurality, m in number, of logic input terminals consecutively ordinally numbered first through $m^{th}$;
a number p, at least one, of programming lines, consecutively ordinally numbered first through $p^{th}$;
a logic output terminal;
a first plurality, m in number, of transistors with fixed threshold voltages, consecutively ordinally numbered first through $m^{th}$, having respective gates connected to respective logic input terminals having the same ordinal numbers as their own, and having respective channels;
a second plurality, m in number, of transistors with fixed threshold voltages, consecutively ordinally numbered m-plus-first through $2m^{th}$, having respective gates connected to respective logic input terminals having ordinal numbers smaller by m than their own, and having respective channels, each pair of said transistors with fixed thresholds having ordinal numbers differing by m being of complementary conductivity types to each other;
a plurality, 2p in number, of transistors with programmable threshold voltages, consecutively ordinally numbered first through $2p^{th}$, having respective gates and having respective channels, the threshold voltage of each of which transistors is electrically alterable by application of a respective programming voltage to its gate, each pair of said transistors with programmable threshold voltages having ordinal numbers differing by p being of complementary conductivity types to each other, each of said transistors with programmable threshold voltage numbered through $p^{th}$ having a gate connected to the programming line having the same ordinal number as its own, and each of the remaining transistors with programmable threshold voltage having a gate connected to the programming line having an ordinal number smaller by p than its own;

a first network connection with intervening nodes of the channels of said first plurality of transistors with fixed threshold voltages and each of said plurality of transistors with programmable threshold voltages and with ordinal number no larger than $p^{th}$, for selectively connecting said output logic terminal to said first supply voltage terminal;

a second network connection with intervening nodes of the channels of said second plurality of transistors with fixed threshold voltages and each of said plurality of transistors with programmable threshold voltages and with ordinal numbers larger than $p^{th}$, for selectively connecting said output logic terminal to said second supply voltage terminal, said first and second network connections being duals of each other insofar as impedance and admittance characteristics of their selective connections are concerned; and means for selectively applying voltages, during such times as programming voltages are applied to said programming lines, to those of said intervening nodes in said first and second network connections as necessary to program the threshold voltages of those transistors with programmable threshold voltages.

50. A programmable logic array formed from connections of field effect transistors, including field effect transistors with fixed-threshold-voltages and including programmable-threshold-voltage field effect transistors with threshold voltages programmable by application of programming voltages between first ends of their respective channels and their respective gates;

wherein the channels of the field effect transistors are arranged to provide selectively conductive paths between a logic output terminal of said array and each of two operating supply terminals, for determining the logic output signal at said logic output terminal;

wherein the gates of the field effect transistors with fixed threshold voltages are connected for receiving logic input signals, at least selected ones of which logic input signals are subject to variation to selectively control the conduction or non-conduction of the channels of the transistors with fixed threshold voltages receiving these signals at their gates;

wherein the gates of the field effect transistors with programmable threshold voltages are connected to receive programming voltages during programming times, for determining whether their conduction channels are to be substantially non-conductive or substantially fully-conductive during ensuing times of normal operation; and wherein means are included for selectively connecting one of the ends of the channel of a respective one of each programmable-threshold-voltage transistor, having neither end of its channel continuously connected to one of said operating supply terminals, to a reference voltage for programming voltages, said selective connection being made responsive to a write signal applied simultaneously with said programming voltages.

51. A programmable logic array formed from connections of field effect transistors, including field effect transistors with fixed-threshold-voltages and including programmable-threshold-voltage field effect transistors with threshold voltages programmable by application of programming voltages between their substrates and their respective gates;

wherein the channels of the field effect transistors are arranged to provide selectively conductive paths between a logic output terminal of said array and each of two operating supply terminals, for determining the logic output signal at said logic output terminal;

wherein the gates of the field effect transistors with fixed threshold voltages are connected for receiving logic input signals, at least selected ones of which logic input signals are subject to variation to selectively control the conduction or non-conduction of the channels of the transistors with fixed threshold voltages receiving these signals at their gates;

wherein the gates of the field effect transistors with programmable threshold voltages are connected to receive programming voltages during programming times, for determining whether their conduction channels are to be substantially non-conductive or substantially fully-conductive during ensuing times of normal operation; and wherein means are included for selectively connecting one of the ends of the channel of a respective one of each programmable-threshold-voltage transistor, having neither end of its channel continuously connected to one of said operating supply terminals, to a reference voltage for programming voltages, said selective connection being made responsive to a write signal applied simultaneously with said programming voltages.

52. A programmable electric network formed from connections of non-programmed switch elements which during normal operation of the network at times programming is not being done respond to signals in a normal range and at least one programmed-conduction switch element selectively connecting a respective pair of nodes each which programmed-conduction switch element is programmable to be either non-conductive or fully conductive responsive to a plurality of programming voltages supplied as bits of a programming instruction, said programmed-switch element being one the conduction of which is not appreciably altered responsive to said signals in a normal range and essentially consists of:

a plurality of programmable-threshold-voltage transistors, each being of a type with its threshold voltage electrically alterable by application of a programming voltage to its gate, said programmable-threshold-voltage transistors being connected as a logic gate for programming instructions, with respective gate electrodes connected for receiving respective ones of the programming voltages that are bits of said programming instruction and with respective channels through selected ones of which said pair of nodes may be selectively connected.

53. A programmable logic array connection of switching transistors and programmable switch elements, with first and second supply voltage terminals, a plurality of logic input connections to the gates of said switching transistors, at least one logic output connection with selectively conductive paths to said first and second supply voltage terminals through respective principal conduction paths of ones of said switching transistors and through respective ones of said programmable switch elements, and a plurality of programming lines, said array characterized in that the conductive state of said programmable switch element is not changed responsive to normal logic levels on said logic input connections and further characterized in that to reduce the number of programming lines required for the array at least one of the programmable switch elements essentially consists of:
- a plurality of programmable-threshold-voltage field effect transistors with respective gates and channels, each being of a type with its threshold voltage electrically alterable by application of a programming voltage to its gate; and
- means connectng said programmable-threshold-voltage transistors as a programmable logic circuit including
- connection of their channels to provide the programmable switch element path that is conductive or non-conductive and including
- connection of their gates to respective ones of said programming lines, at least one of which is also used in applying programming voltage to another of said programmable switch elements.

54. A progranmable logic array connection of switching transistors and programmable switch elements, with first and second supply voltage terminals, a plurality of logic input connections to the gates of said switching transistors, and at least one logic output connection with selectively conductive paths to said first and second supply terminals through respective principal conduction paths of ones of said switching transistors and through respective ones of said programmable switch elements, said array characterized in that the conductive state of said programmable switch elements is not changed responsive to normal logic levels on said logic input connections and further charcterized in that to facilitate the application of programming voltages through said logic input connections at least one of the programmable switch elements essentially consists of:
- means connecting said programmable-threshold-voltage transistors as a programmable logic circuit including
- connection of their channels to provide the programmable switch element path that is conductive or non-conductive and including
- connection of their gates to respective ones of said logic input connections, at least one of which is also used in applying programming voltage to another of said programmable switch elements.

55. A COSMOS logic array having first and second supply voltage terminals; a multiplicity m of logic input terminals consecutively ordinally numbered first through $m^{th}$; at least one logic output terminal; a multiplicity m of n-channel logic FET's associated with each logic output terminal, being consecutively ordinally numbered first through $m^{th}$, having channels arranged with intervening nodal connections in a first network of series and parallel branches for selectively connecting the logic output terminal associated therewith to said first supply voltage terminal, and having gates connected to the ones of said logic input terminals having the same ordinal numbers as their own; and a multiplicity m of p-channel logic FET's associated with each logic output terminal, being consecutively ordinally numbered first through $m^{th}$, having gates connected to the ones of said logic input terminals having the same ordinal numbers as their own and having channels arranged with intervening nodal connections in a second network of series and parallel branches for selectively connecting the logic output terminal associated therewith to said supply voltage terminal, said first and second networks being duals of each other insofar as impedance and admittance are concerned, said COSMOS logic array modified so as to be programmable by inclusion of programmable-$V^T$ FET's each of a type in which $V^T$ is electrically alterable responsive to voltage applied to its gate, which array is further characterized by:
- the channel of a respective programmable-$V^T$ FET paralleling the channel of each logic FET that is serially connected with another logic FET, the channel of each logic FET that is serially connected with a parallel combination of circuit branches, and each parallel combinations of circuit branches that is serially connected with a logic FET;
- the channel of a respective programmable-$V_T$ FET being interposed in series with the channel of each logic FET that is parallelly connected with another logic FET, the channel of each logic FET that is parallelly connected with a series combination of circuit branches, and each series combination of circuit branches that is parallelly connected with a logic FET; and
- means for applying at selected times, programming voltages to the gates of said programmable $V_T$ FET's, and reference voltages to such of said intervening nodal connections as necessary to permit programming of all said programmable-$V_T$ FET's.

56. A programmable logic array as set forth in claim 55, wherein each pair of programmable-$V_T$ FET's with channels in said first and second networks which are duals of each other insofar as impedance and admittance are concerned have their gates interconnected for receiving programming voltage.

57. A programmable logic array as set forth in claim 55, wherein the interconnected gates of programmable $V_T$ FET's, the channels of which are in series and in parallel with a pair of logic FET's with gates connected to a logic input terminal, are also connected to that logic input terminal.

58. A COS/MOS logic array having first and second supply voltage terminals; a multiplicity m of logic input terminals consecutively ordinally numbered first through $m^{th}$; at least one logic output terminal; a multiplicity m of n-channel logic FET's associated with each logic output terminal, being consecutively ordinally numbered first through $m^{th}$, having channels arranged with intervening nodal connections in a first network of series and parallel branches for selectively connecting the logic output terminal associated therewith to said first supply voltage terminal, and having gates connected to the ones of said logic input terminals having the same ordinal numbers as their own; and a multiplicity m of p-channel logic FET associated with each logic output terminal, being consecutively ordinally numbered first through $m^{th}$, having gates connected to the ones of said logic input terminals having the same ordinal numbers as their own and having channels arranged with intervening nodal connections in a second network of series and parallel branches for selectively connecting the logic output terminal associated therewith to said second supply voltage terminal, said first and second networks being duals of each other insofar as impedance and admittance are concerned—said COS/MOS logic array modified so as to be programmable by inclusion of programmable-$V_T$ FET's each of a type in which $V_T$ is electrically alterable responsive to voltage applied to its gate, which array is further characterized by:

the channel of a respective programmable-$V_T$ FET parallelling the channel of each logic FET that is serially connected with another logic FET, and the channel of each logic FET that is serially connected with a parallel combination of circuit branches;

the channel of a respective programmable-$V_T$ FET being interposed in series with the channel of each logic FET that is parallelly connected with another logic FET, and the channel of each logic FET that is parallelly connected with a series combination of circuit branches;

means connecting the gate of each programmable-$V_T$ FET in series with a logic FET to the same logic input terminal as the gate of that logic FET;

means connecting the gate of each programmable-$V_T$ FET in parallel with a logic FET to the same logic input terminal at the gate of that logic FET;

respective switch means parallelling each parallel combination of circuit branches that is serially connected with a logic FET for conducting only when the programmable-$V_T$ FET's in all of the circuit branches in that parallel combination prevent any of them from being conductive, each comprising a logic-gate connection of the channels of programmable-$V_T$ FET's with gates connected to respective ones of the logic input terminals connected to the gates of the programmable-$V_T$ FET's in the parallel combination with which that respective switch means is associated;

switch means interposed in series with each series combination of circuit branches that is parallelly connected with a logic FET for conducting except when the programmable-$V_T$ FET's in all of the circuit branches in that series connection prevent any of them from being non-conductive, each comprising a logic-gate connection of the channels of programmable-$V_T$ FET's with gates connected to respective ones of the logic input terminals connected to the gates of programmable-$V_T$ FET's in that series combination with which that respective switch is associated; and means for applying at selected times, programming voltages to said logic input terminals, and reference voltages to such of said intervening nodal connections as necessary to permit programming of all said programmable-$V_T$ FET's.

59. A programmable logic gate comprising:
and second supply voltage terminals;

a first plurality, n in number, of floating-gate MOSFET's, consecutively ordinally numbered first through $n^{th}$, each having a substrate in electrical connection with one of said first and second supply voltage terminals, having a respective principal current conduction path with first and second ends and having a respective control gate electrode;

a second plurality, n in number, of floating-gate MOSFET's, consecutively ordinally numbered first through $n^{th}$, each having a substrate in electrical connection with one of said first and second supply voltage terminals, having a respective principal current conduction path with first and second ends having a respective control gate electrode;

a plurality, n in number, of further transistors of a first conductivity type, consecutively ordinally numbered first through $n^{th}$, each having a respective principal current conduction path with first and second ends and having a respective control electrode;

a plurality, n in number, of further transistors of a second conductivity type, complementary to said first conductivity type, consecutively ordinally numbered first through $n^{th}$, each having a respective principal current conduction path with first and second ends and having a respective control electrode;

a plurality, n in number, of input terminals, consecutively ordinally numbered first through $n^{th}$, each of which input terminals connects to the oontrol electrodes of the pair of said further transistors having ordinal numbers the same as its ordinal number;

an output terminal;

series connections between said first supply voltage terminal and said output terminal of each of the principal current conduction paths of said floating-gate MOSFET's of said first plurality with the principal current conduction path of the one of said further transistors of said first conductivity type bearing the same ordinal number;

parallel connections of each of the principal current conduction paths of said floating-gate MOSFET's of said second plurality with the principal current conduction path of the one of said further transistors of said second conductivity type having the same ordinal number, which parallel connections are serially connected between said output terminal and said supply voltage terminal; and means selectively applying a respective programming potential between the gate electrode of each of said floating-gate MOSFET's and one of said first and second supply voltage terminals for programming that path to be relatively low resistance or relatively high resistance.

60. A programmable logic gate as set forth in claim 59 wherein said first plurality of floating gate MOSFET's are gate-injection MOSFET's of said first conductivity type; wherein the first ends of the principal current conduction paths of said gate-injection MOSFET's of first conductivity type connect to said first supply voltage terminal; wherein their control gate electrodes connect to the respective input terminals having the same ordinal number as their own to provide said means for programming the resistances of their principal current conduction paths; wherein the second ends of their principal current conduction paths connect to the first ends of the principal current conduction paths of said further transistors of said first conductivity type respectively having the same ordinal numbers as their own; and wherein the second ends of the principal current conduction paths of said further transistors of first conductivity type connect to said output terminal.

61. A programmable logic gate as set forth in claim 60 wherein said second plurality of floating gate MOSFET's are gate-injection MOSFET's of said second conductivity type, with their control gate electrodes respectively connected to the ones of said input terminals having the same ordinal number as their own; wherein the first ends of the principal current conduction paths of the first of said second plurality of gate-injection MOSFET's and of the first of said further transistors of second conductivity type connect to said second voltage supply terminal; wherein the first ends of the principal current conduction paths of the rest of the parallelled ones of said second plurality of gate-injection MOSFET's and of said further transistors of said second conductivity type having the same ordinal number connect, at respective nodes having ordinal numbers smaller by one, to the second ends of the principal current conduction paths of the parallelled ones of said second plurality of gate-injection MOSFET's and of said further transistors of said second conductivity type having ordinal numbers smaller by one; wherein the second ends of the principal current conduction paths of the $n^{th}$ ones of said second plurality of gate-injection MOSFET's and of said further transistors of said second conductivity type connect to said output terminal; and wherein there is included:
- a number n-1 of switch means, each selectively connecting the node having the same ordinal number as its own to said second supply voltage terminal during times programming potential is applied to the control gate electrode of the one of said second plurality of gate-injection MOSFET's having an ordinal number larger by one than its own.

62. A programmable logic gate as set forth in claim 59 wherein said second plurality of floating-gate MOSFET's are gate-injection MOSFET's of said second conductivity type, with their control gate electrodes respectively connected to the ones of said input terminals having the same ordinal number as their own; wherein the first ends of the principal current conduction paths of the first of said second plurality of gate-injection MOSFET's and of the first of said further transistors of second conductivity type connect to said second voltage supply terminal; wherein the first ends of the principal current conduction paths of the rest of the parallelled ones of said second plurality of gate-injection MOSFET's and of said further transistors of said second conductivity type having the same ordinal number connect, at respective nodes having ordinal numbers smaller by one, to the second ends of the principal current conduction paths of the parallelled ones of said second plurality of gate-injection MOSFET's and of said further transistors of second conductivity type having ordinal numbers smaller by one; wherein the second ends of the principal current conduction paths of the $n^{th}$ ones of said second plurality of gate injection MOSFET's and of said further transistors of said second conductivity type connect to said output terminal; and wherein there is included:
- a number n-1 of switch means, each selectively connecting the node having the same ordinal number as its own to said second supply voltage terminal during times programming potential is applied to the control gate electrode of the one said second plurality of gate-injection MOSFET's having an ordinal number larger by one than its own.

63. A programmable logic gate as set forth in claim 59 wherein said first plurality of floating-gate MOSFET's are substrate-injection MOSFET's of said first conductivity type; wherein the first ends of the principal current conduction paths of said substrate-injection MOSET's of first conductivity type connect to said first supply voltage terminal; wherein their control gate electrodes connect to the respective input terminal having the same ordinal number as their own to provide said means for programming the resistances of their principal current conduction paths; wherein the second ends of their principal current conduction paths of said further transistors of said first conductivity type respectively having the same ordinal numbers as their own; and wherein the second ends of the principal current conduction paths of said further transistors of first conductivity type connect to said output terminal.

64. A programmable logic gate as set forth in claim 63 wherein said second plurality of floating-gate MOSFET's are substrate-injection MOSFET's of said second conductivity type, with their control gate electrodes respectively connected to the ones of said input terminals having the same ordinal number as their own; wherein the first ends of the principal current conduction paths of the first of said second plurality of substrate-injection MOSFET's and of the first of said further transistors of second conductivity type connect to said second voltage supply terminal; wherein the first ends of the principal current conduction paths of the rest of the parallelled ones of said second plurality of substrate-injection MOSFET's and of said further transistors of said second conductivity type having the same ordinal number connect, at respective nodes having ordinal numbers smaller by one, to the second ends of the principal current conduction paths of the parallelled ones of said second plurality of substrate-injection MOSFET's and of said further transistors of said second conductivity type having ordinal numbers smaller by one; wherein the second ends of the principal current conduction paths of the $n^{th}$ ones of said second plurality of substrate-injection MOSFET's and of said further transistors of said second conductivity type connect to said output terminal; and wherein there is included:
- a number n-1 of switch means, each selectively connecting the node having the same ordinal number as its own to said second supply voltage terminal during times programming potential is applied to the gate electrode of the one of said second plurality of substrate-injection MOSFET's having an ordinal number larger by one than its own.

65. A programmable logic gate as set forth in claim 59 wherein said second plurality of floating-gate MOSFET's are substrate-injection MOSFET's of said second conductivity type, with their control gate electrodes respectively connected to the ones of said input terminals having the same ordinal number as their own; wherein the first ends of the principal current conduction paths of the first of said second plurality of substrate-injection MOSFET's and of the first of said further transistors of second conductivity type connect to said second voltage supply terminal; wherein the first ends of the principal current conduction paths of the rest of the parallelled ones of said second plurality of substrate-injection MOSFET's and of said further transistors of said second conductivity type having the same ordinal number connect, at respective nodes having ordinal numbers smaller by one, to the second ends of the principal current conduction paths of the parallelled ones of said second plurality of substrate-injection MOSFET's and of said further transistors of said second conductivity type having ordinal numbers smaller by one; wherein the second ends of the principal current conduction paths of the $n^{th}$ ones of said second plurality of substrate-injection MOSFET's and of said further transistors of said second conductivity type connect to said output terminal; and wherein there is included:

a number n-1 of switch means, each selectively connecting the node having the same ordinal number as its own to said second supply voltage terminal during times programming potential is applied to the gate electrode of the one of said second plurality of substrate-injection MOSFET's having an ordinal number larger by one than its own.

* * * * *